US006650014B2

(12) United States Patent
Kariyazaki

(10) Patent No.: US 6,650,014 B2
(45) Date of Patent: Nov. 18, 2003

(54) SEMICONDUCTOR DEVICE

(75) Inventor: Shuuichi Kariyazaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/170,842

(22) Filed: Jun. 13, 2002

(65) Prior Publication Data

US 2003/0011071 A1 Jan. 16, 2003

(30) Foreign Application Priority Data

Jun. 19, 2001 (JP) ........................................ 2001-184899

(51) Int. Cl.$^7$ ........................... H01L 23/48; H01L 23/52
(52) U.S. Cl. ..................... 257/737; 257/786; 257/780; 257/693; 257/778
(58) Field of Search ................................ 257/737, 786, 257/780, 693, 778

(56) References Cited

U.S. PATENT DOCUMENTS

| | | | | |
|---|---|---|---|---|
| 5,982,033 A | * | 11/1999 | Ohsawa et al. ............. | 257/737 |
| 6,107,685 A | * | 8/2000 | Nishiyama ................. | 257/737 |
| 6,125,042 A | * | 9/2000 | Verdi et al. ................. | 361/760 |
| 6,177,733 B1 | * | 1/2001 | Obara ........................ | 257/786 |
| 6,403,896 B1 | * | 6/2002 | Ma et al. .................... | 174/261 |
| 6,448,639 B1 | * | 9/2002 | Ma ............................. | 257/691 |
| 6,459,161 B1 | * | 10/2002 | Hirata et al. ................ | 257/786 |
| 6,489,682 B1 | * | 12/2002 | Yeh et al. ................... | 257/738 |
| 6,541,844 B2 | * | 4/2003 | Miyata et al. .............. | 257/666 |

FOREIGN PATENT DOCUMENTS

JP          5-62978          3/1993

* cited by examiner

*Primary Examiner*—Jasmine Clark
(74) *Attorney, Agent, or Firm*—Cheate, Hall & Stewart

(57) ABSTRACT

A semiconductor device has a plurality of bump electrodes for external connection arrayed two-dimensionally on the surface of a semiconductor chip where the desired elements and wirings are formed. The bump electrodes include a first group of bump electrodes, a second group of bump electrodes arrayed at the outer periphery of the first group of bump electrodes, and a third group of bump electrodes, arrayed at the outer periphery of the second group of bump electrodes. The first and second groups of bump electrodes are arrayed in a grid with intervals $Sx1$ in the X direction and $Sy1$ in the Y direction. The third group of bump electrodes has a structure satisfying $Sx2>Sx1$ and $Sy2>Sy1$, where $Sx2$ and $Sy2$ are orthogonal intervals for the third group of bump electrodes along axes diagonal to axes of intervals of the first and second groups of bump electrodes.

16 Claims, 20 Drawing Sheets

SEMICONDUCTOR DEVICE

BACKGROUND OF THE INVENTION

1. Field of the Invention

The present invention relates to a semiconductor device. In particular, it relates to an array configuration of a group of bump electrodes for external connection on a flip-chip LSI (hereafter referred to as a FCLSI) having a group of bump electrodes for external connection on the surface of a semiconductor chip, or an array structure of a group of external connection terminals of a ball grid array LSI (hereafter referred to as a BGA) comprising a group of bump-shaped external connection terminals on one surface of a package.

2. Description of the Prior Art

As the scale and density of LSI increases, conventional systems configured with a plurality of LSI devices may now be integrated on one semiconductor chip. Specifically, in LSI used for communication systems, since signal processing of a plurality of channels on one chip has become possible, the number of signal lines drawn out of one chip, that is, the number of electrodes for external connection can be increased dramatically. Meanwhile, further miniaturization is required for LSI applied to mobile equipment, such as personal handy phones, thus the FCLSI or BGA is proposed, where the external connect terminals are arrayed two-dimensionally in order to achieve, multiple terminals and miniaturization, and the terminal array pitch is narrowed, as well as ingenuity has effected the layout method, this is accompanied by a further increase of the number of terminals.

For example, in Japanese Patent Application Laid-Open No. Hei 5-62978 (hereafter referred to as the well-known example), a flip chip, wherein layout density is increased while maintaining distance between bumps by arranging the bumps in a staggered pattern with the same pitch throughout, is mentioned.

However, in the conventional FCLSI and BGA, for example, since a simple grid array or a staggered grid array such as that in the well-known example is adopted for all external connect terminals, although LSI may be accomplished, a new problem for mounting the LSI in practical use occurs when the array pitch becomes narrow. In other words, when the LSI where the external connect terminals are arrayed two-dimensionally, either in a simple grid array or a staggered grid array, on a printed wiring board (hereafter referred to as PWB), it becomes difficult to connect to the signal terminals at any distance more than two rows away from the outermost periphery. FIG. 20 is a diagram for illustrating this problem; FIG. 20A is a typical plane view of a PWB 930 mounting surface, on which electronic components including the conventional LSI 900 are mounted; and FIG. 20B is a typical plane view of the enlarged P section shown in FIG. 20A. For example, in FCLSI or BGA with the narrowest bump array pitch, the number of wires capable of passing through the connection electrodes corresponding to each external connect terminal of the LSI formed on a PWB used for mounting, is limited (normally to one). Consequently, when the number of wires capable of passing through the connection electrodes is, for example, one as shown in FIG. 20, all feeder wires 935 for regions outside the LSI mounting section 900P, can be formed with one wiring layer for the connection electrodes 957, which connect the signal terminals accommodated within the region containing the two rows adjacent to the outermost periphery, however, in order to draw the signal terminals out of an LSI area containing more than two rows inside of the outermost periphery, for that reason alone, it is necessary to make the PWB multi-layered, thereby leading to increased PWB costs.

In addition, it is common for FCLSI to have arranged in it an input/output buffer circuitry (hereafter referred to as I/O circuitry) for giving and receiving signals to and from the external connect terminals along the edge of the chip and to rewire the spaces between the I/O circuitry and the external connect terminals on the chip. However, since the wiring on the chip has cross sectional area that is significantly smaller than that of the wiring on the PWB on which the chip is mounted, there are problems such as a voltage drop occurring due to the wiring between the I/O circuitry and the power supply terminal, which supplies power to the circuitry, and the size of voltage drop becomes larger in proportion to the wiring length.

BRIEF SUMMARY OF THE INVENTION

1. Objectives of the Invention

The objective of the present invention is to provide LSI having external connect terminals, such as bump electrodes, which are arrayed two-dimensionally on the same surface; wherein the LSI comprises a layout of external connect terminals capable of easily accommodating the feeder interconnects drawn out of the LSI mounting area from signal connection electrodes, which connect the external connect signal terminals of the LSI, with a single wiring layer in the PWB on which the LSI is mounted, even if the number of signal terminals are increased.

2. Summary of the Invention

A semiconductor device of the present invention comprises a plurality of bump electrodes for external connection arrayed two-dimensionally on the surface of a rectangular- or square-shaped semiconductor chip where the desired elements and wirings are formed; wherein when directions of two edges of the chip orthogonal to each other are specified as X and Y directions, all of the bump electrodes are arranged at either of the grid points determined with a distance Sx1 between grids in the X direction and a distance Sy1 between grids in the Y direction, and the bump electrodes include a first group of bump electrodes, a second group of bump electrodes arrayed at the outer periphery of the first group of bump electrodes, and a third group of bump electrodes arrayed at the outer periphery of the second group of bump electrodes, wherein the first group of bump electrodes and the second group of bump electrodes are arrayed like a grid with an array interval distance Sx1 in the X direction and an array interval distance Sy1 in the Y direction, and the third group of bump electrodes has a structure satisfying Sx2>Sx1 and Sy2>Sy1, when an array interval distance in the X direction of the third group of bump electrodes arranged in the first area, which is enclosed by edges, which are parallel to a diagonal line of the chip and the X direction, is specified as Sx2, and an array interval distance in the Y direction of the third group of bump electrodes arranged in the second area, which is enclosed by edges, which are parallel to a diagonal line of the chip and the Y direction, is specified as Sy2.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 5 is a diagram describing the PWB.

FIG. 17 is a diagram, which describes an example of the PWB on which the LSI of the modified example of the second embodiment is mounted.

DETAILED DESCRIPTION OF THE INVENTION

Next, the present invention is described with reference to the drawings.

Figure 4:
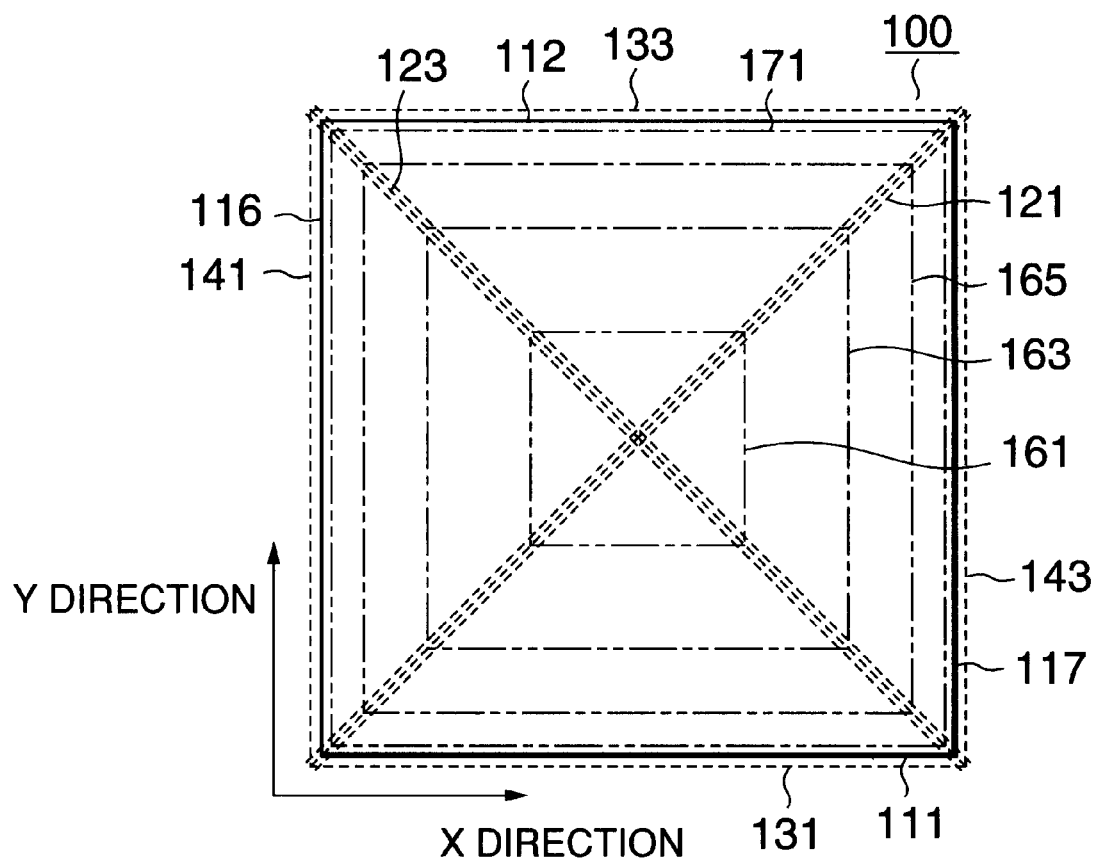
FIG. 4 is a plane view for describing the definitions of a chip such as edge of the chip, direction of the edge, and regions.

First, in order to make the following description easier to understand, definitions such as the edge of the chip, direction of the edge, and the area, which are commonly used in the following description of each embodiment, are described with reference to FIG. 4. Diagonal lines 121 and 123, a first boundary line 161, a second boundary line 163, a third boundary line 165, and an edge boundary line 171 are provided on the surface of a chip 100 as virtual lines. In addition, the second boundary line 163 falls in the outer periphery of the first boundary line 161; the third boundary line 165 falls in the outer periphery of the second boundary line 163; and the edge boundary line 171 falls in the outer periphery of the third boundary line 165. The edge boundary line 171 is substantially parallel with the edge section of the chip 100. In addition, the area enclosed by the first edge 111, which is an edge in the X direction, and the diagonal lines 121 and 123, and the area enclosed by the first edge 112 and diagonal lines 121 and 123 are regarded as the first areas 131 and 133, respectively; whereas the area enclosed by the second edge 116, which is an edge in the Y direction, and diagonal lines 121 and 123, and the area enclosed by the second edge 117 and diagonal lines 121 and 123 are regarded as the second areas 141 and 143, respectively.

Next, the first embodiment of the present invention is described.

Figure 1:
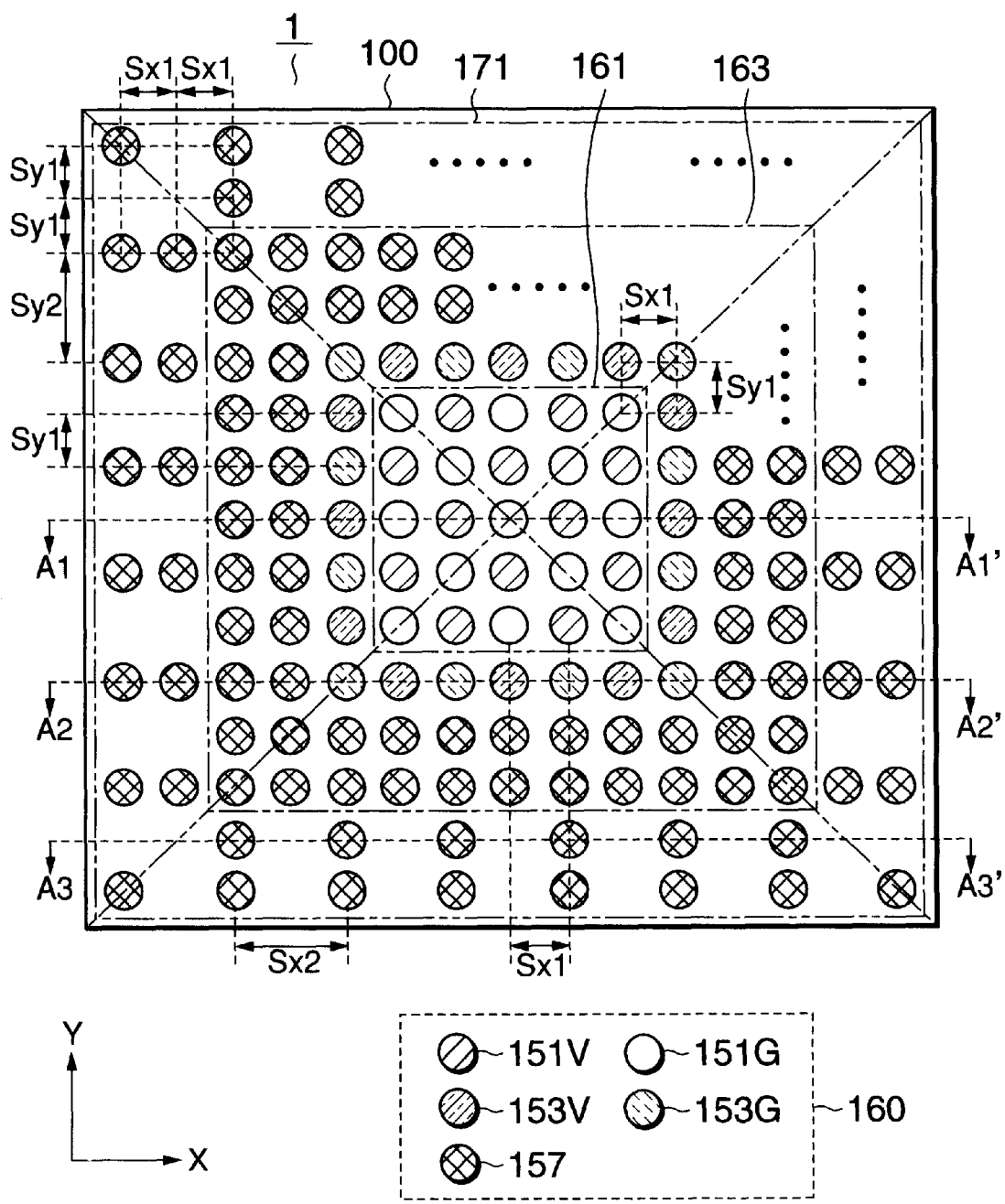
FIG. 1 is a diagram, which describes the first embodiment of the LSI of the present invention, and is a typical plane view illustrating a layout of bump electrodes for external connection.
Figure 2A:
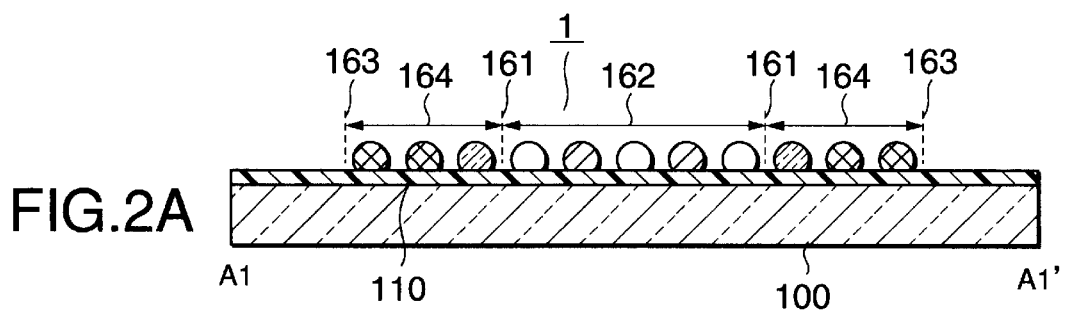
FIGS. 2A, 2B, and 2C are typical cross sectional views illustrating cross sections cut along the lines A1–A1', A2–A2', and A3–A3' shown in FIG. 1.
Figure 2B:
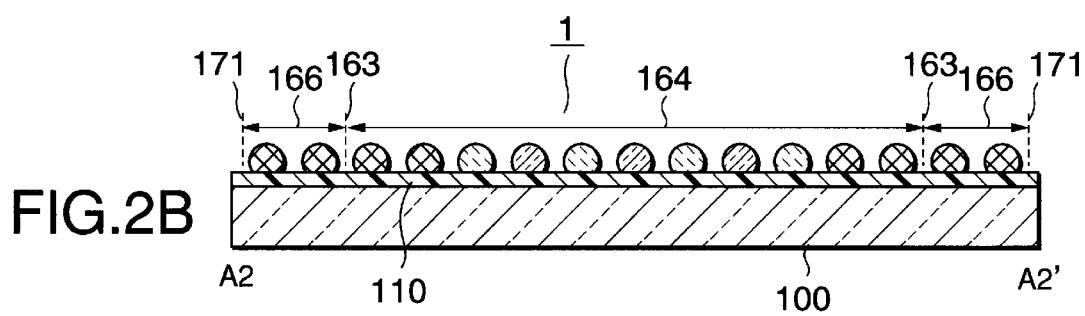
Figure 2C:
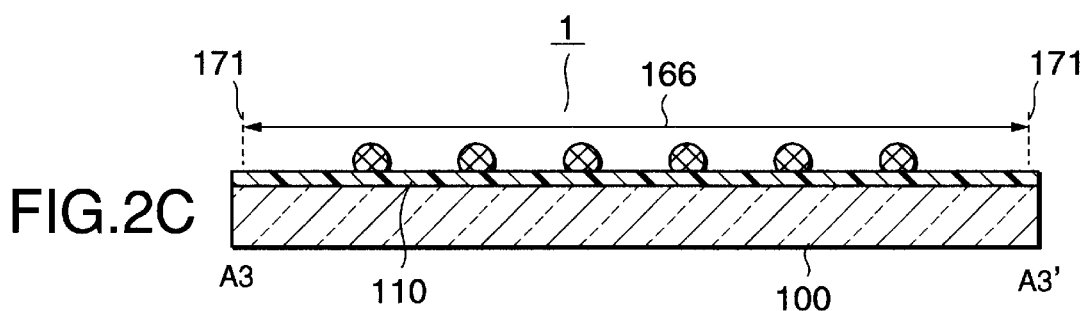
Figure 3:
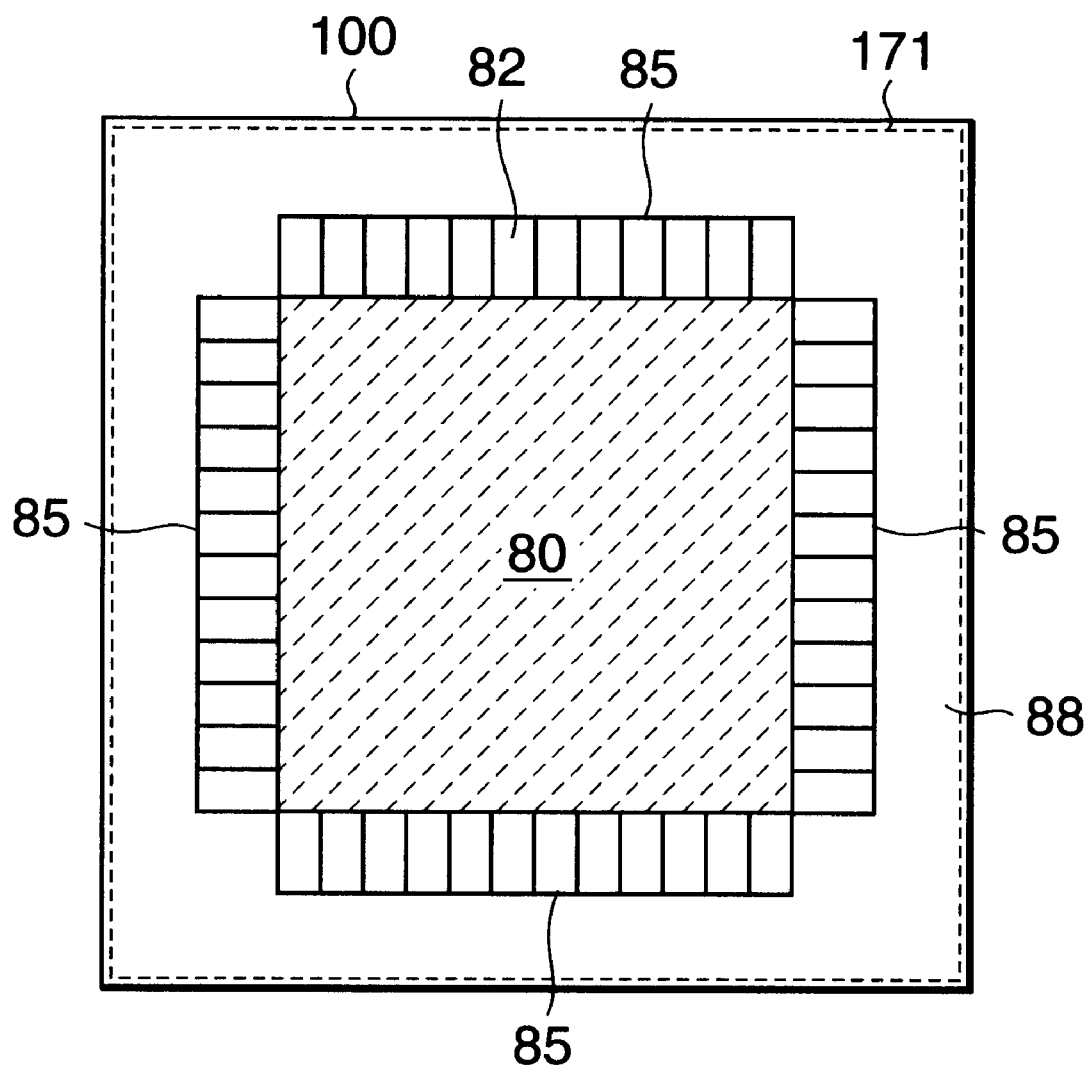
FIG. 3 is a typical plane view illustrating an outline of the chip structure of LSI most suitable for this embodiment.

Referencing FIGS. 1, 2, and 3, the LSI 1 of this embodiment comprises internal circuitry 80, which performs the desired functions, and I/O circuitries 85, which input/output signals to/from the external connect terminals within the chip 100; wherein the I/O circuitries 85 are arranged so as to substantially enclose the internal circuitry 80. In addition, the I/O circuitries 85 comprise a plurality of input/output buffer cells 82 (hereafter referred to as I/O cells). It should be noted that the I/O circuitries 85 of the chip 100 are arranged proximate to the center of the chip 100 by spacing from the edge boundary line 171; and the chip 100 includes peripheral area 88 where, for example, bonding pads (not shown in the Figure), can be arranged between the I/O circuitries 85 and the edge boundary line 171, if necessary.

The chip 100, on which the desired elements and wirings are formed, comprises external connect terminals (not shown in the Figure), which are arranged two-dimensionally via an insulating film 110, such as a polyimide resin, on the surface, (on the surface where the elements and wiring are formed), and includes the bump electrodes 160 for external connection, such as solder balls, on the external connect terminals. It should be noted that each terminal where a bump electrode 160 is mounted is connected to a corresponding electrode having an I/O cell 82 of the chip 100 by means of the rearrangement wiring; however, graphic representation is omitted since it is not directly related to the structure of the present invention.

To begin with, an outline of the layout structure of the bump electrodes 160 is described. The bump electrodes 160 of the LSI 1 of this embodiment are arranged at any of the grid points of the virtual matrix grid, which are specified by the distance Sx1 between grids in the X direction and the distance Sy1 between grids in the Y direction on the entire surface of the chip 100, and include a first group of bump electrodes 162 arranged at the center of the chip 100; a second group of bump electrodes 164 arranged in the outer periphery of the first group of bump electrodes 162; and a third group of bump electrodes 166 arranged in the outer periphery of the second group of bump electrodes 164. More specifically, for example, the first group of bump electrodes 162 is arranged within the area enclosed by the first boundary line 161; the second group of bump electrodes 164 is arranged within a circular area between the first boundary line 161 and second boundary line 163; and the third group of bump electrodes 166 is arranged within a circular area between the second boundary line 163 and the edge boundary line 171. In addition, the first group of bump electrodes 162 and second group of bump electrodes 164 are arrayed on the entire surface of the layout area like a matrix with the array interval distance Sx1 in the X direction and array interval distance Sy1 in the Y direction. The third group of bump electrodes 166 is arrayed like a matrix with the array interval distance Sx2 in the X direction and array interval distance Sy1 in the Y direction, for example, in the first areas 131 and 133; whereas it is arrayed with the array interval distance Sx1 in the X direction and array interval distance Sy2 in the Y direction like a matrix in the second areas 141 and 143. It should be noted that Sx2=2×Sx1 and Sy2=2×Sy1 in this embodiment.

Next, an outline of the functions of each group of bump electrodes is described. The first group of bump electrodes 162 is constructed by arranging the first bump electrodes 151V for power supply, which supply the high-potential power, and the first bump electrodes 151G for power supply, which supply the low-potential power, alternately, in order to make the internal circuitry 80 in the LSI 1 operate. The second group of bump electrodes 164 is constructed by arranging the second power supply bump electrodes 153V, which supply high-potential power, and the second power supply bump electrodes 153G, which supply low-potential power, in a single line in the innermost perimeter line, alternately, in order to make the I/O circuitries 85 in the LSI 1 operate; as well as by arranging the signal bump electrodes 157, which input/output the signals to/from the chip 100, in the outer periphery of the second power supply bump electrodes 153V and 153G. Moreover, a third group of bump electrodes 166 is constructed by arranging only the signal bump electrodes 157, which input/output the signals from the LSI 1.

Figure 5A:
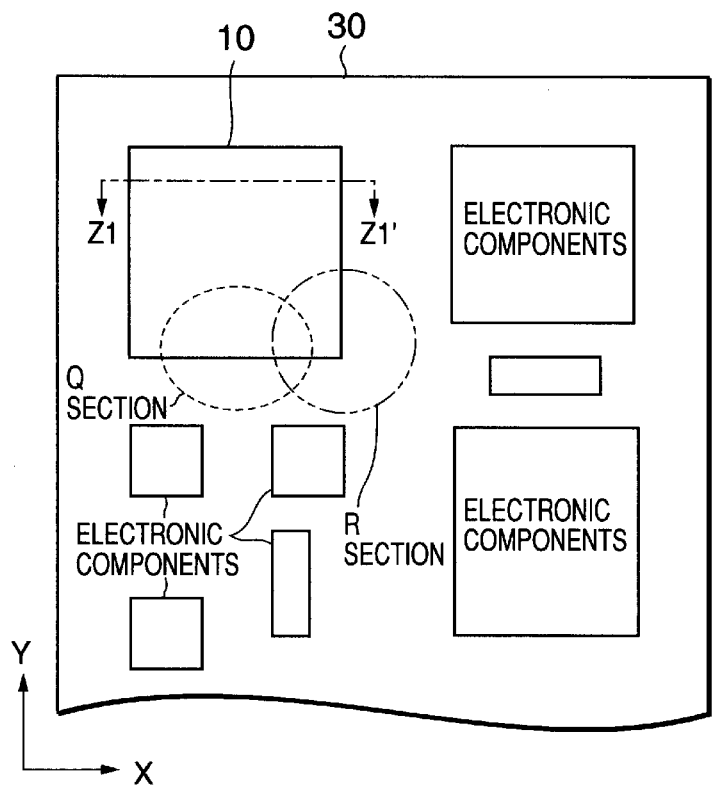
FIG. 5A is a typical plane view of the PWB on which various electronic components including the LSI are mounted.
Figure 5B:
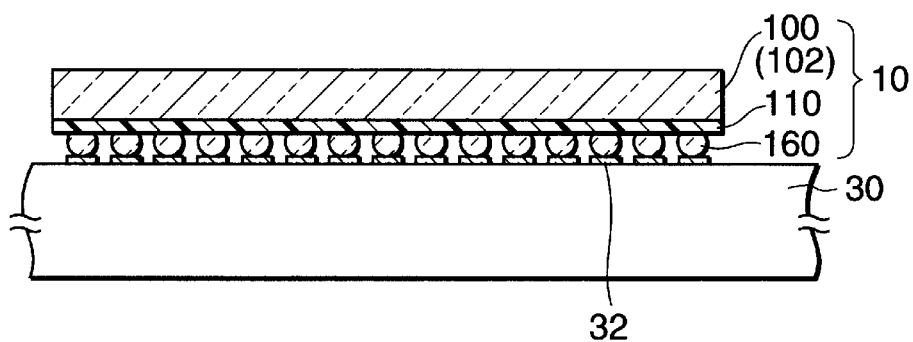
FIG. 5B is a typical cross-sectional view cut along the line Z1–Z1' shown in FIG. 5A.
Figure 6:
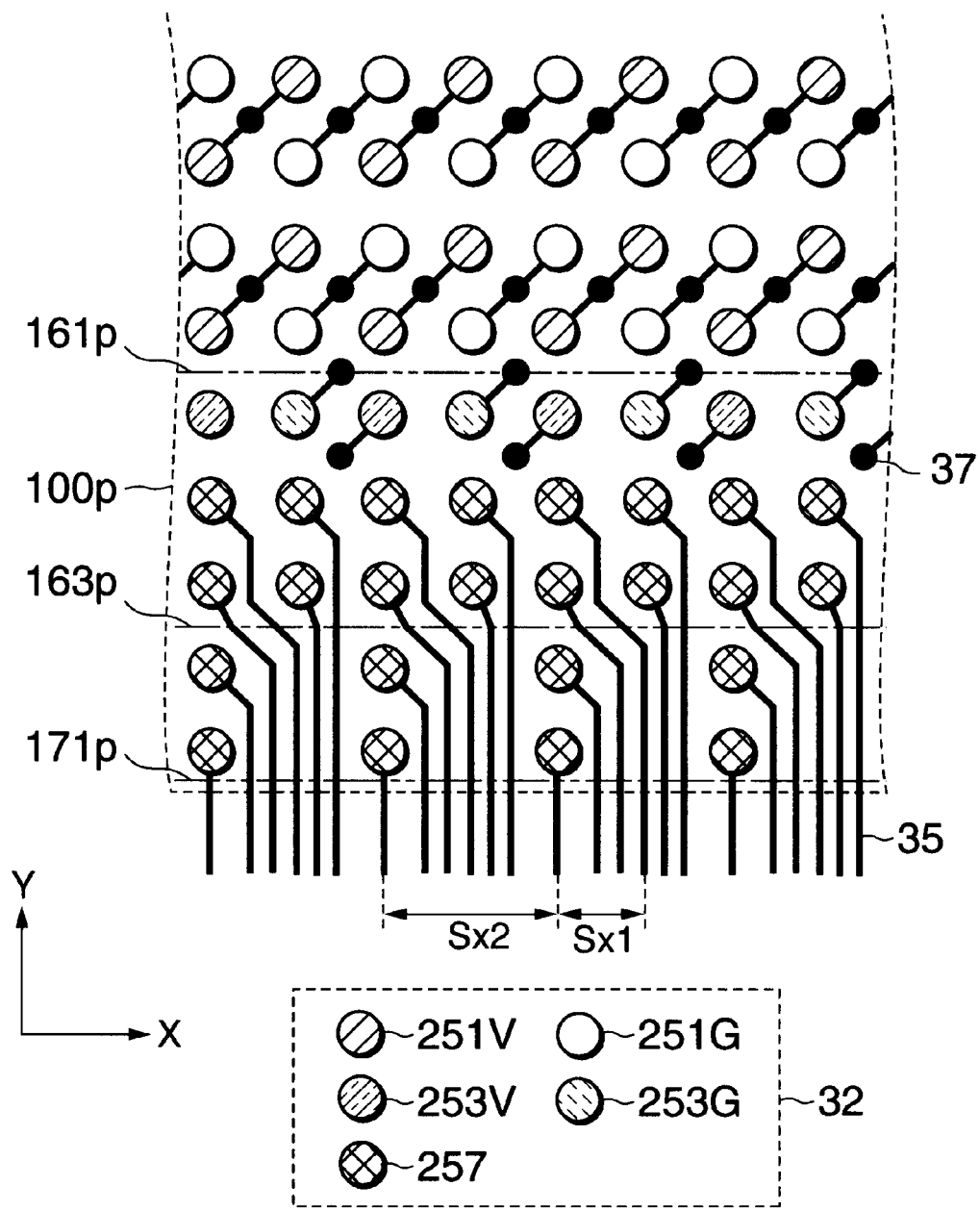
FIG. 6 is an enlarged typical plane view of the section corresponding to the Q section shown in FIG. 5A.

Next, the PWB on which the LSI 1 is mounted is described while referencing FIGS. 5 and 6. When the LSI 1 is mounted on the PWB 30, the connection electrodes 32, which are formed on the LSI mounting section 100p, comprise first power supply connection electrodes 251V and 251G; second power supply connection electrodes 253V and 253G; and connection electrodes 257, which correspond to the first power supply bump electrodes 151V and 151G; the second power supply bump electrodes 153V and 153G; and the signal bump electrodes 157 of the LSI 1, respectively. It should be noted that power is supplied from different wiring layers, and that the first connection electrodes 251V and 251G for power supply and the second connection electrodes 253V and 253G for power supply are connected to corresponding wiring layers (not shown in the Figure) via the through holes 37 in the PWB 30. In addition, it goes without saying that the layout intervals of each of these connection electrodes are the same as those of each of the corresponding bump electrodes. It should be noted that in order to simplify the following description, a first PWB-side virtual boundary line 161p, a second PWB-side virtual boundary line 163p, and a PWB-side virtual edge boundary line 171p are provided at locations corresponding to the first virtual boundary line 161, the second boundary line 163, and edge boundary line 171, which has been used for describing the layout of bump electrodes of the LSI 1. In addition, in each area separated by diagonal lines and edge sections in the LSI mounting section 100p, a direction, which is parallel to the edge section of the LSI mounting section 100p, that is, the X direction in the first areas 131 and 133, or the Y direction in the second areas 141 and 143 of the chip 100 may be regarded as the horizontal direction; whereas the direction, which travels from the edge section of the LSI mounting section 100p to the center, that is, the Y direction in the first areas 131 and 133, or the X direction in the second areas 141 and 143 of the chip 100 may be regarded as the vertical direction.

When the design criteria of the wiring patterns comprising the connection electrodes of the PWB 30 are specified as, for example:
connection electrode diameter: 100 $\mu$m;
feeder wire width: 30 $\mu$m;
insulation interval between connection electrodes and wiring: 60 $\mu$m or wider; and
insulation interval between wirings: 30 $\mu$m or wider, the number of wires capable of passing between connection electrodes is one in an area when the layout interval of the connection electrodes is 250 $\mu$m, but becomes five when 500 $\mu$m. Consequently, when layout intervals of each bump electrode of the LSI 1 are specified, for example, as Sx1=Sy1=250 $\mu$m and Sx2=Sy2=500 $\mu$m for the first two rows from the outermost perimeter in the area between the PWB side virtual edge boundary line 171p and the second PWB side virtual boundary line 163p, the horizontal layout intervals are 500 $\mu$m and the vertical layout intervals are 250 $\mu$m. In addition, the layout intervals of the connection electrodes within the area enclosed by the second PWB side virtual boundary line 163p are 250 $\mu$m in both of the horizontal and vertical directions. Consequently, for the connection electrodes, which are arranged in the first two rows from the outermost periphery side within the area enclosed by the second PWB side virtual boundary line 163p, the feeder wires 35, which are drawn out of the LSI mounting section 100p, may be provided with only one wiring layer in accordance with the design criteria of the wiring pattern as shown in FIG. 6. In other words, feeder wires 35 may be provided for all signal connection electrodes 257, which connect the bump electrodes 157 for signals of the LSI 1 with only one wiring layer in accordance with the design criteria of the wiring pattern in the PWB 30.

Next, the increase of the number of signal terminals according to this embodiment is verified. However, it is assumed that the number of wires capable of passing through is one and five when the intervals of connection electrodes are S and 2S, respectively. To begin with, after the connection electrodes have been arranged as with the conventional manner like a matrix with the number of wires capable of passing through an interval of S being one, and the first two rows from the outer most periphery being used as connection electrodes for signals, if number of connection electrodes of one row from the outermost periphery is given as m, then the number of signal connection electrodes that may be obtained by the conventional simple matrix layout, that is, the number of signal bump electrodes is (2m−8). Meanwhile with the layout shown in FIG. 1 of this embodiment, it becomes (3m−44). Accordingly, if m is more than 36, the number of signal terminals can be increased without changing the wiring criteria of the mounting substrate in accordance with the layouts of the bump electrodes of this embodiment.

Figure 7:
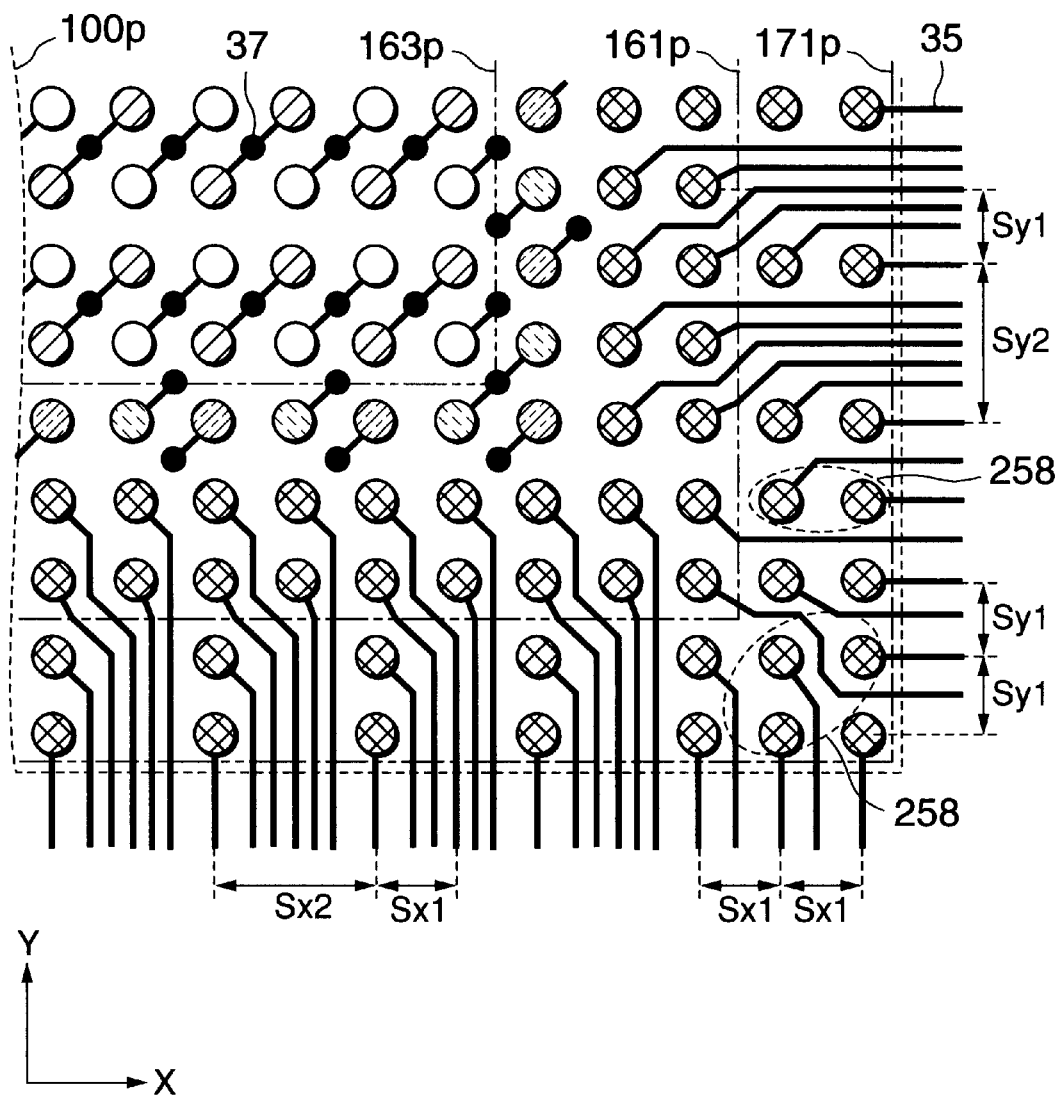
FIG. 7 is an enlarged plane view of the section corresponding to the R section shown in FIG. 5A.

Moreover, in the example of this embodiment, since the horizontal layout intervals of the bump electrodes and corresponding connection electrodes of the PWB 30 in the first two rows from the outermost periphery are specified as 250 $\mu$m at the corners, feeder wires from the periphery side of the PWB 30 are not affected even if, for example, the connection electrodes 280 are added as shown in FIG. 7. It should be noted that FIG. 7 is an enlarged plane view of the section corresponding to the R section shown in FIG. 5A. Since the number of signal connection electrodes that can be used when this layout is adopted, that is, the number of signal bump electrodes is (3m−24), the number of signal terminals can be further increased without changing the wiring criteria of the mounting substrate when m is more than 16.

Figure 8:
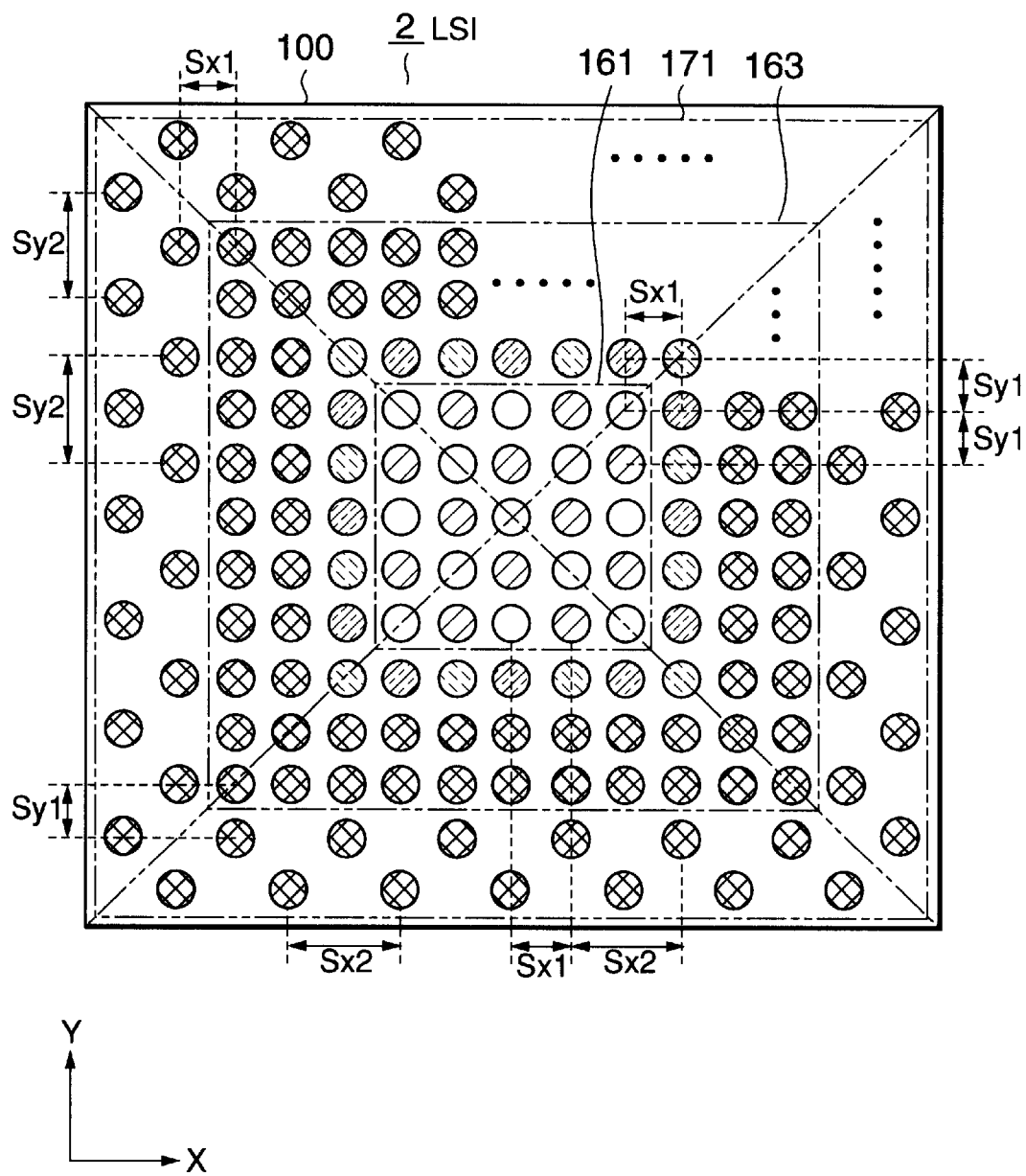
FIG. 8 is a typical plane view illustrating a layout of bump electrodes for external connection in the LSI of the modified example of the first embodiment.
Figure 9:
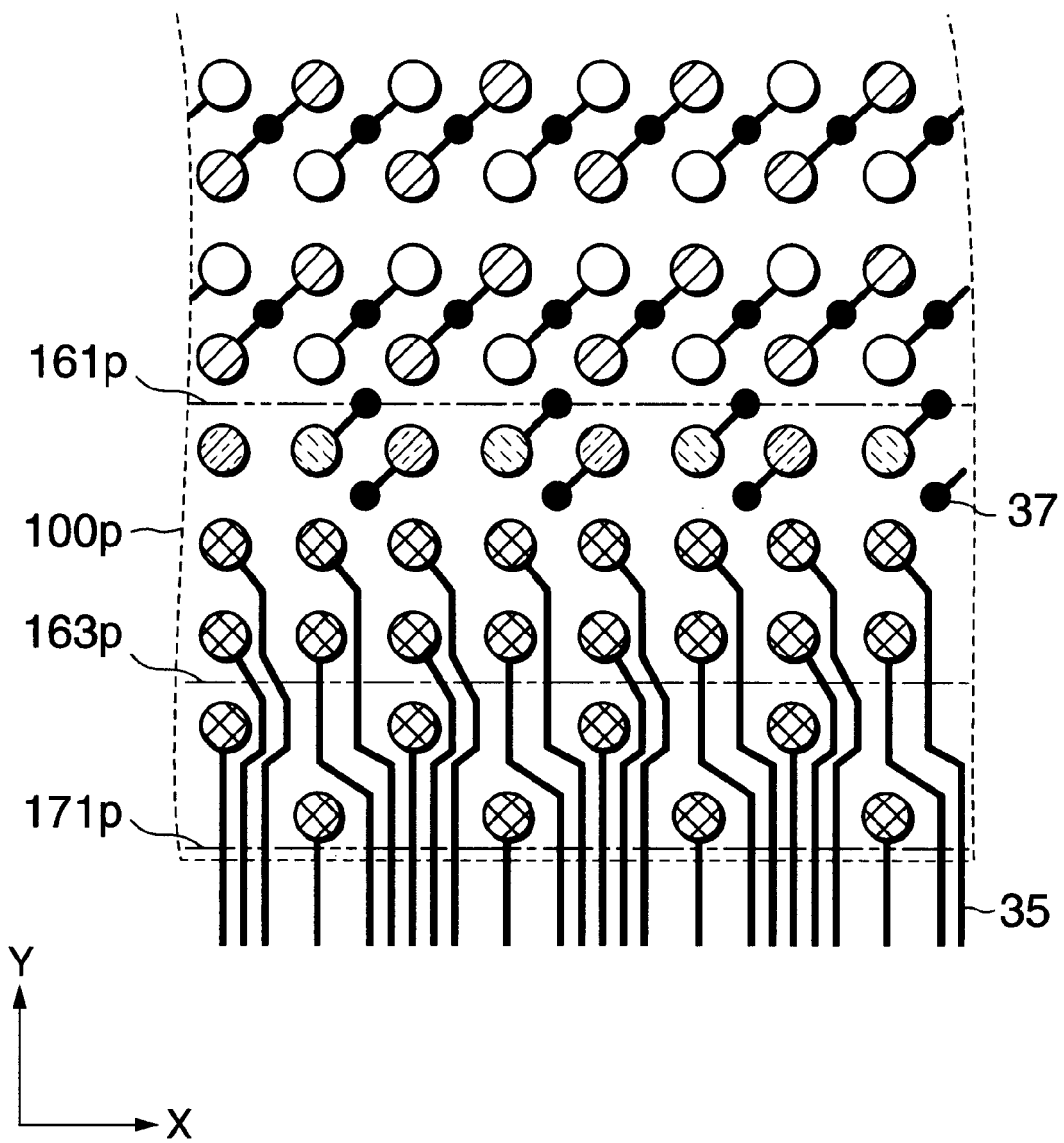
FIG. 9 is an enlarged plane view of the section corresponding to the Q section shown in FIG. 5A.
Figure 10:
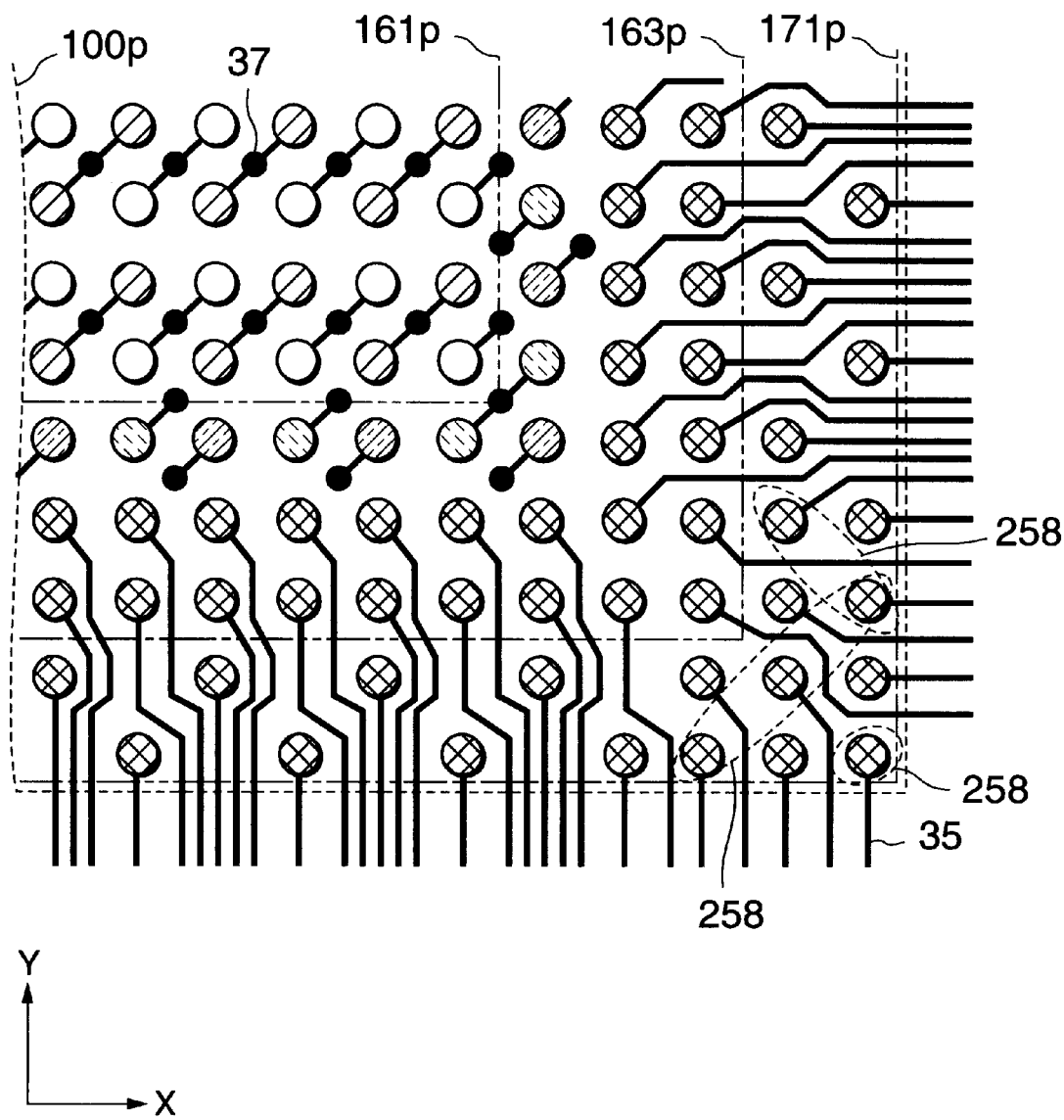
FIG. 10 is an enlarged plane view of the section corresponding to the R section shown in FIG. 5A.

Next, the modified example of this embodiment is described. FIG. 8 is a typical plane view illustrating the layout of the external connection bump electrodes of the LSI 2 of this modified example; and FIG. 9 is an typical enlarged plane view of the section that corresponds to the Q section shown in FIG. 5A, which illustrates the layout of the connection electrodes and feeder wires of the LSI mounting section when the LSI 2 is mounted on the PWB 30. Moreover, FIG. 10 is an enlarged plane view of the section that corresponds to the R section shown in FIG. 5A when the number of bump electrodes at the corners of the LSI 2 is increased. In the LSI 2 of this modified example, the third group of bump electrodes 166 is arrayed within a circular area between the second boundary line 163 and the edge boundary line 171 like a staggered grid. In this case, the array interval distances in the X and Y directions are Sx2 and Sy1 in the first areas 131 and 133, respectively; whereas the array interval distances in the X and Y directions are Sx1 and Sy2 in the second areas 141 and 143, respectively. In addition, by arranging the feeder wires from the signal connection electrodes of the PWB 30 on which the LSI 2 with the third group of the bump electrodes 166 arrayed like a staggered grid is mounted, as shown in FIG. 8, the feeder wires 35 may be provided for all signal connection electrodes 257, which connect the signal bump electrodes 157 of the LSI 2 with only one wiring layer in accordance with the design criteria of the wiring pattern of the PWB 30, and thus the number of signal terminals may be increased. In addition, since the corners of this modified example are similar to those of this embodiment, if it is assumed that the layout intervals of the bump electrodes, the layout intervals of the corresponding connection electrodes of the PWB, and the number of wires capable of passing through the connection electrodes have the same numeric values as the above, then by adding the connection electrodes 280 to the first two rows from the outermost periphery, as shown in FIG. 10, the horizontal layout interval may be specified as 250 μm without affecting the feeder wires from the connection electrodes at the inner periphery side of the PWB, the number of signal connection electrodes that may be used in this case, and accordingly, the number of signal bump electrodes to be (3m−24), and the number of signal terminals may be further increased without having to change the wiring criteria of the mounting substrate when m is more than 16.

In addition, in the LSI on which the I/O circuitries 85 are positioned proximate to the center of the chip as shown in FIG. 3, since the second power supply bump electrodes 153V and 153G for energizing the I/O circuitries 85 can be arranged adjacent to the I/O circuitries 85, there is an effect that it is possible to moderate the voltage drop due to the wirings, which connect the second power supply bump electrodes 153V and 153G to the I/O circuitries 85.

Figure 11:
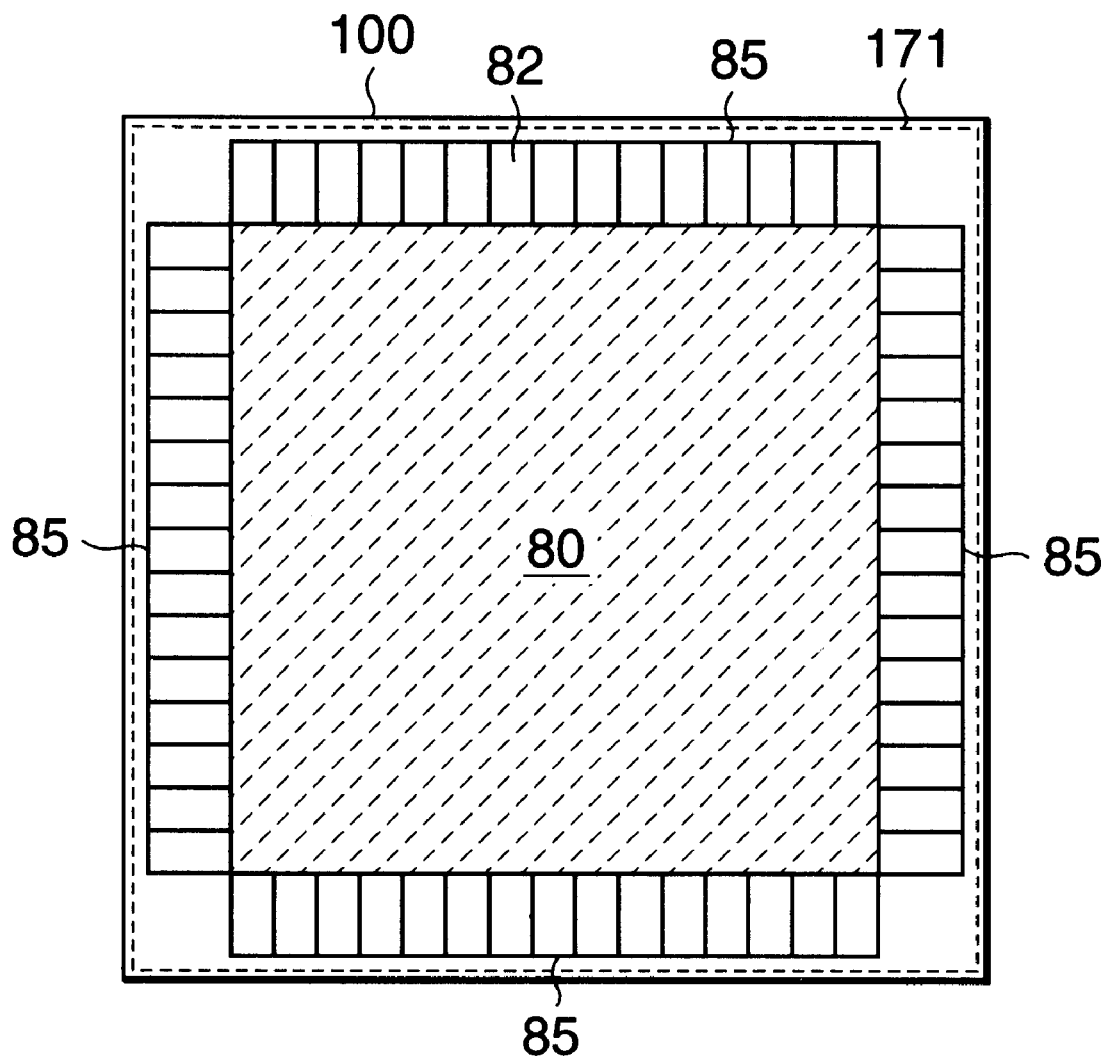
FIG. 11 is a typical plane view illustrating a outline of the chip structure in the LSI of the second embodiment of the present invention.
Figure 12:
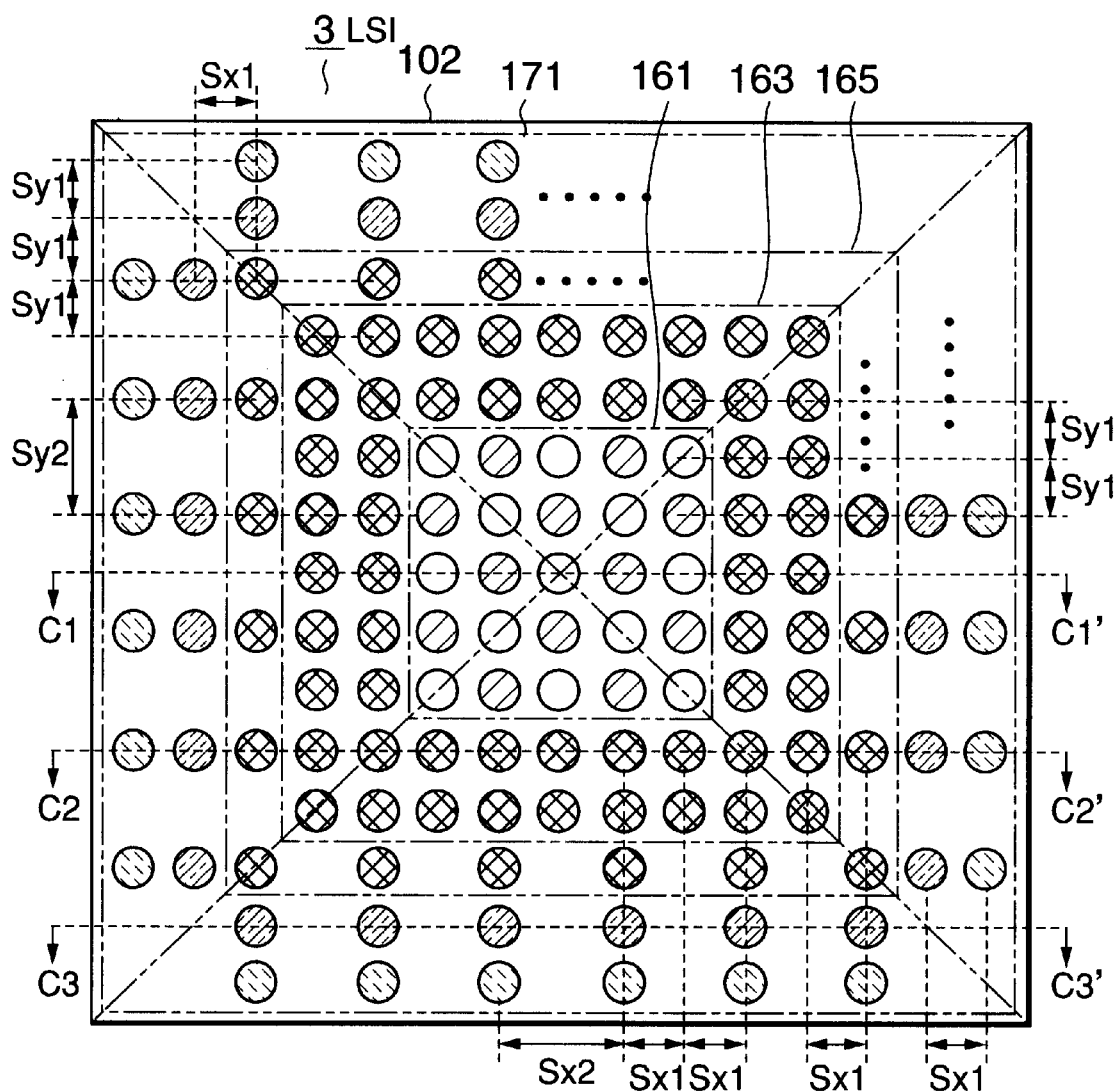
FIG. 12 is a diagram, which describes the LSI of the second embodiment of the present invention, and is a typical plane view illustrating the layout of bump electrodes for external connection.
Figure 13A:
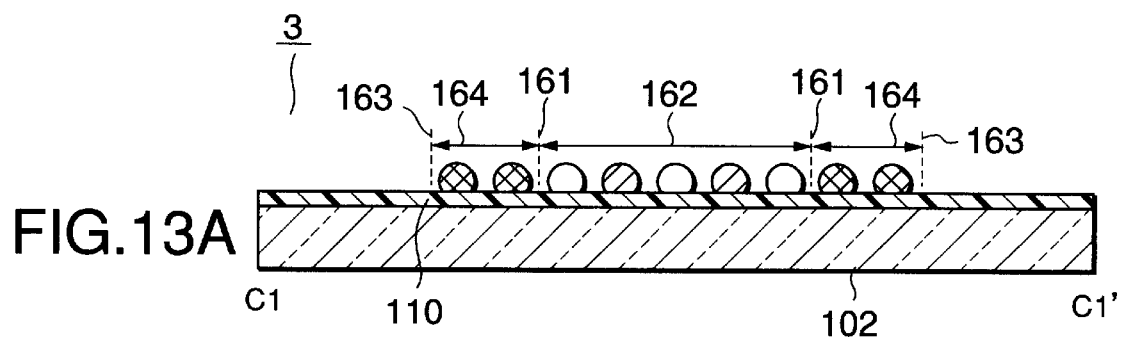
FIGS. 13A, 13B, and 13C are cross-sectional views typically illustrating the cross sections respectively cut along lines C1–C1', C2–C2', and C3–C3' shown in FIG. 12.
Figure 13B:
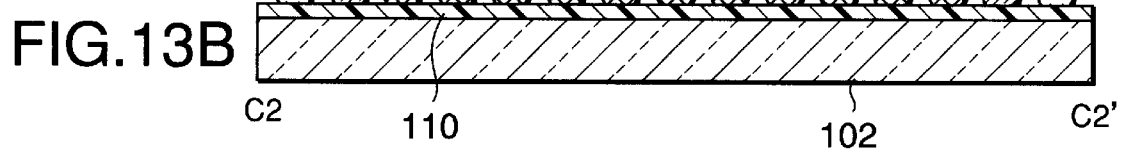
Figure 13C:
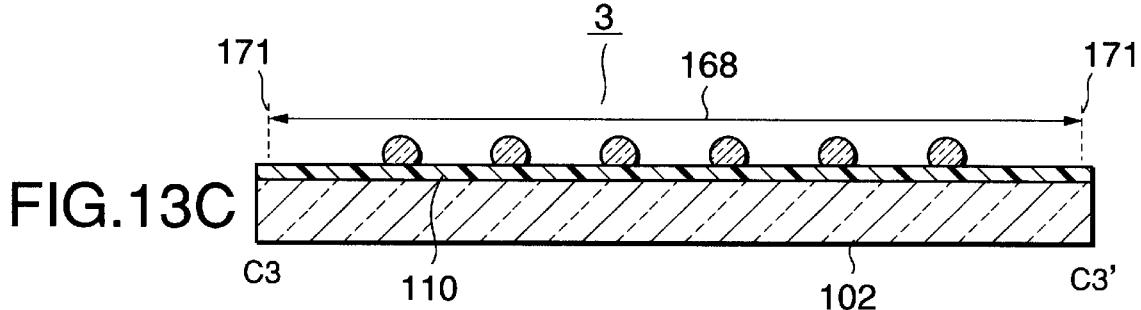

Next, the second embodiment of the present invention is described with-reference to FIGS. 11 through 13.

The LSI 3 of this embodiment includes internal circuitry 80 implementing the desired functions and I/O circuitries 85 within the chip 102, wherein the I/O circuitries 85 are arranged so as to substantially enclose the internal circuitry 80, and the I/O circuitries 85 comprise a plurality of the I/O cells 82. In the chip 102 of this embodiment, since the I/O circuitries 85 are arranged adjacent to the edge boundary line 171 but not on the peripheral area 88, which is a dead space, between the I/O circuitries 85 and the edge boundary line 171, the size of the internal circuitry 80 can be enlarged even if the chip size is the same as that of chip 100 of the first embodiment. However, there are some advantages to the dead space in the chip 100 such as the fact that the chip 100 may be used as a chip for wire bonding connection without modification by pre-fabricating the bonding pads in the peripheral area 88.

Next, omitting the description of portions that are similar to the first embodiment and use the same reference numerals, a bump electrode layout having a principal difference is described.

The bump electrodes 160 of the LSI 3 of this embodiment are also arranged at any of the grid points of a virtual matrix grid, which are specified by the distance Sx1 between grids in the X direction and the distance Sy1 between grids in the Y direction on the entire surface of the chip 102, and include a first group of bump electrodes 162 arranged at the center of a chip 102; a second group of bump electrodes 164 arranged at the outer periphery of the first group of bump electrodes 162; a third group of bump electrodes 166 arranged at the outer periphery of the second group of bump electrodes 164; and a fourth group of bump electrodes 168 arranged at the outer periphery of the third group of bump electrodes 166. More specifically, the first group of bump electrodes 162 is arranged within a area enclosed by a first boundary line 161; the second group of bump electrodes 164 is arranged within a circular area between the first boundary line 161 and a second boundary line 163; the third group of bump electrodes 166 are arranged within a circular area between the second boundary line 163 and a third boundary line 165; and the fourth group of bump electrodes 168 is arranged within a circular area between the third boundary line 165 and an edge boundary line 171. In addition, the first group of bump electrodes 162 and second group of bump electrodes 164 are arrayed like a matrix on the entire surface of the layout area with the array interval distance Sx1 in the X direction and array interval distance Sy1 in the Y direction. The third group of bump electrodes 166 is arranged, for example, in a single row with an array interval distance Sx2 in the X direction in the first areas 131 and 133; and arranged in a single row with an array interval distance Sy2 in the Y direction in the second areas 141 and 143. The fourth group of bump electrodes 168 is arranged like a matrix with, for example, an array interval distance Sx2 in the X direction and an array interval distance Sy1 in the Y direction in the first areas 131 and 133; and arranged like a matrix with the array interval distance Sx1 in the X direction and the array interval distance Sy2 in the Y direction in the second areas 141 and 143. It should be noted that Sx2=2×Sx1 and Sy2=2×Sy1 in this embodiment as well.

Next, an outline of the functions of each group of bump electrodes is described. The first group of bump electrodes 162 is constructed by arranging first power supply bump electrodes 151V and 151G, which allow the internal circuitry 80 of the LSI 3 to operate, alternatingly, in this embodiment. The second group of bump electrodes 164 and third group of bump electrodes 166 are constructed by arranging only the signal bump electrodes 157, which input/output the signal to/from the chip 102. In the fourth group of bump electrodes 168, second power supply bump electrodes 153V and 153G, which allow the I/O circuitries 85 of the LSI 3 to operate, are arranged, for example, in respective pairs in the Y direction in the first areas 131 and 133; arranged in respective pairs in the X direction in the second areas 141 and 143.

Figure 14:
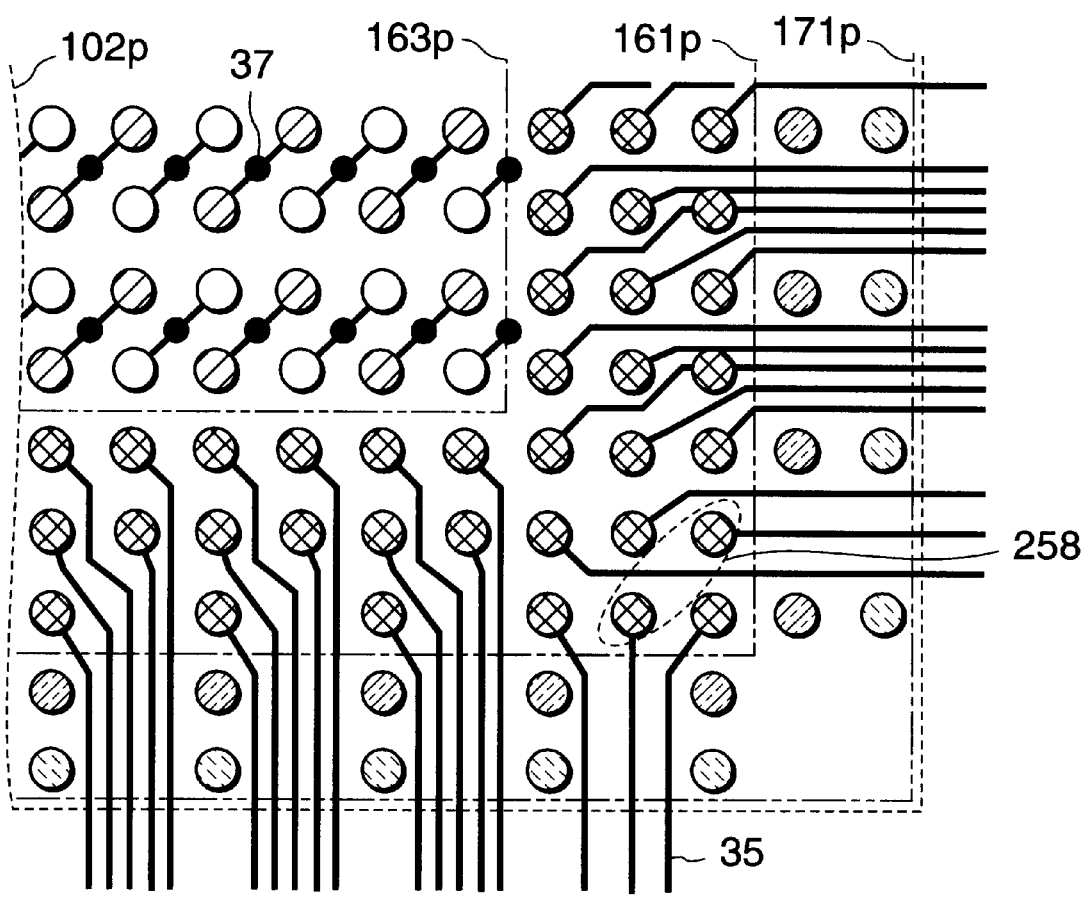
FIG. 14 is an enlarged typical plane view of the section corresponding to the R section shown in FIG. 5A.

With the LSI 3 this embodiment, feeder wires for all of the signal connection electrodes 257 connecting the signal bump electrodes of the LSI 3, which are provided on the inside of the second power source connection electrodes 253V and 253G that connect the second power source bump electrodes 153V and 153G, may be provided in only one layer while still following a standard PWB wiring pattern layout in a PWB whereupon an LSI 3 has been mounted having the voltage drop due to the wires that connect the second power supply bump electrodes 153V and 153G to the I/O circuitries 85 mitigated by arranging the second power supply bump electrodes 153 V and 153G in the first two rows from the outermost periphery and widening the horizontal layout intervals relative to the chip 102 on which I/O circuitries 85 have been arranged adjacent to the edge boundary line 171. FIG. 14 illustrates a typical plane view of an example of the feeder interconnect pattern for the PWB, wherein the section corresponding to the R section shown in FIG. 5A is enlarged. In FIG. 14, the signal connection electrodes 258 are connection electrodes that may be added in accordance with the characteristics of the corner.

Upon verification of the increased number of signal connection electrodes, it was found that the number of signal bump electrodes that may be provided in the LSI 3 of this embodiment was (2.5m−64) when prerequisites of the first embodiment such as the intervals of connection electrodes and the number of wires capable of passing through were met. In contrast, if m is more than 48, then more bump electrodes for signals may be provided on the LSI 3 of this embodiment since the number of signal bump electrodes is (2m−40) when the bump electrodes 157 for signals are provided in first two rows from the inner periphery side of the second power supply bump electrodes 153V and 153G.

Next, a modified example of the second embodiment is described with reference to FIGS. 15 and 16.

This modified example has a structure suitable for the case where the PWB on which the LSI is mounted comprises conductive patterns, such as metals, which are connected to at least the entire surface of the peripheral area of the LSI mounting area, for example on the low-potential side (normally, ground potential) of the power source, in order to provide maximum restraint of the affects of electromagnetic noise from the outside.

Figure 15:
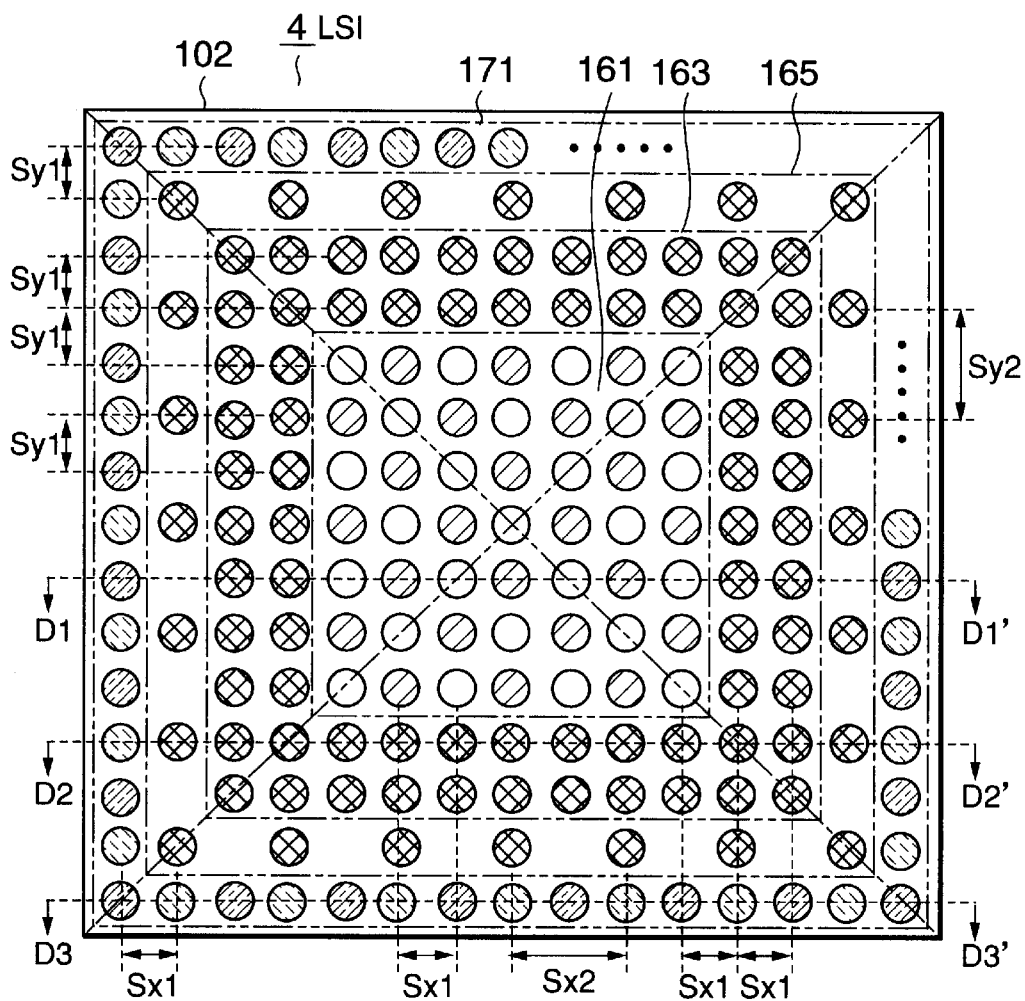
FIG. 15 is a diagram, which describes the LSI of the modified example of the second embodiment, and is a typical plane view illustrating the layout of bump electrodes for external connection.
Figure 16A:
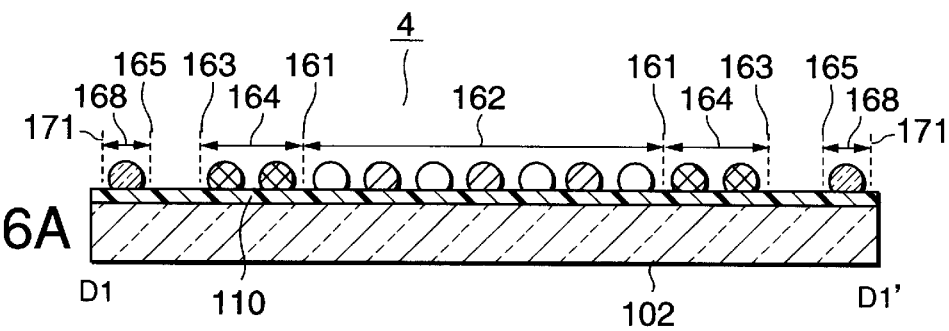
FIGS. 16A, 16B, and 16C are typical cross-sectional views respectively illustrating the cross-sections cut along lines D1–D1', D2–D2', and D3–D3' shown in FIG. 15.
Figure 16B:
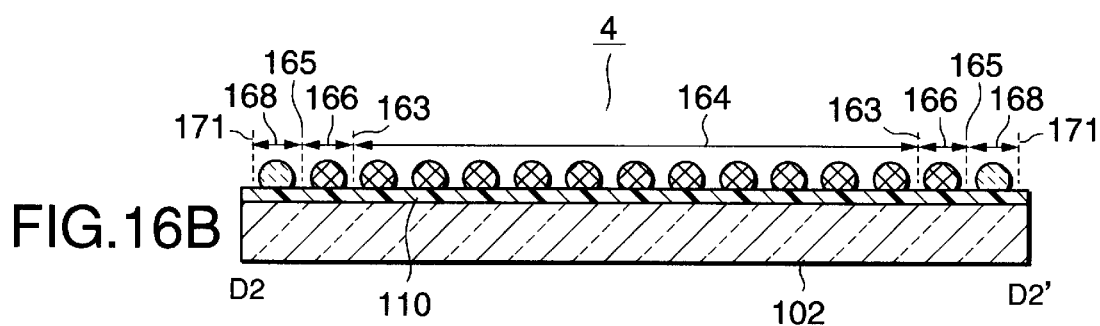
Figure 16C:
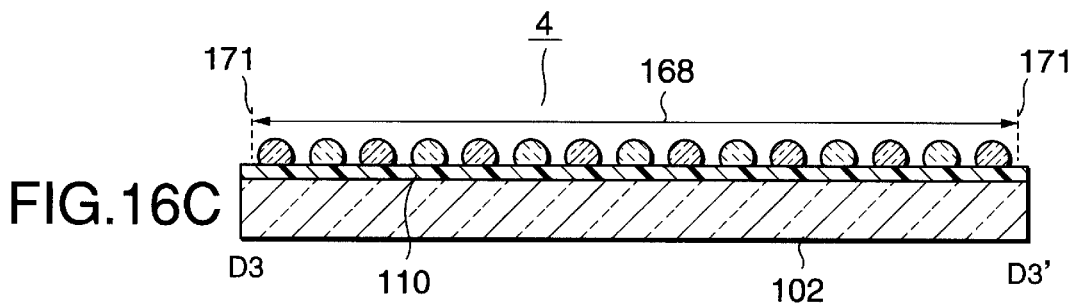

Referencing FIGS. 15 and 16, the LSI 4 of this modified example also comprises the chip 102 with the same structure as that of the second embodiment. Since only the layout method of the fourth group of bump electrodes 168 of the LSI 4 of this modified example differs from the LSI 3 of the second embodiment, this section will mainly describe the layout method. The fourth group of bump electrodes 168 in this modified example is arranged in a single row with an array interval distance Sx1 in the X direction in the first areas 131 and 133, and arranged in a single row with the array interval distance Sy1 in the Y direction in the second areas 141 and 143 within a circular area between the third boundary line 165 and edge boundary line 171. In addition, the fourth group of bump electrodes 168 includes only the second power supply bump electrodes 153V and 153G, and arranges them alternatingly.

Figure 17A:
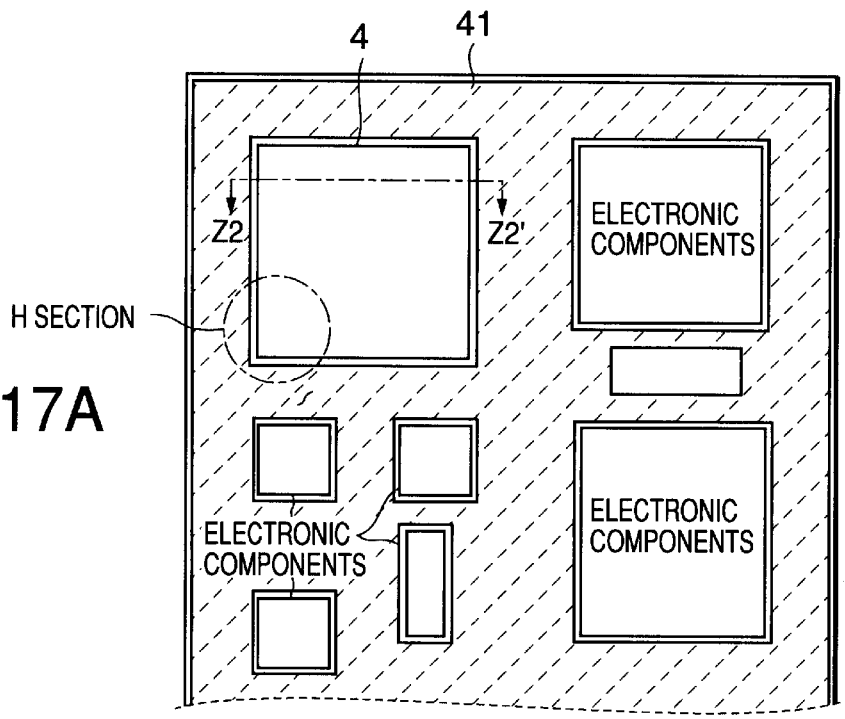
FIG. 17A is a typical outline plane view of the surface on which the components are mounted.
Figure 17B:
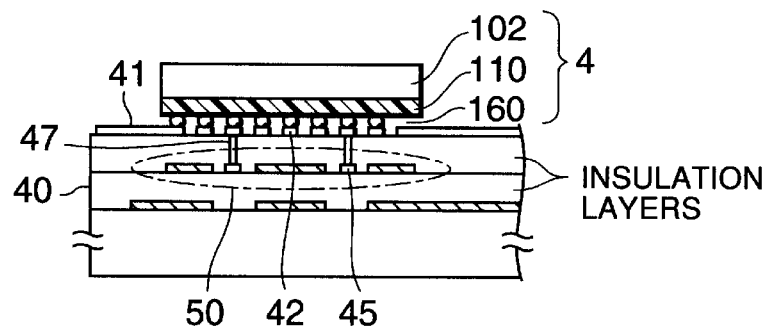
FIG. 17B is a cross sectional view illustrating the outline cross section along the line Z2–Z2' shown in FIG. 17A when the LSI 4 is mounted.

Next, a PWB whereupon the LSI 4 is mounted is described while referencing FIG. 17.

Figure 17C:
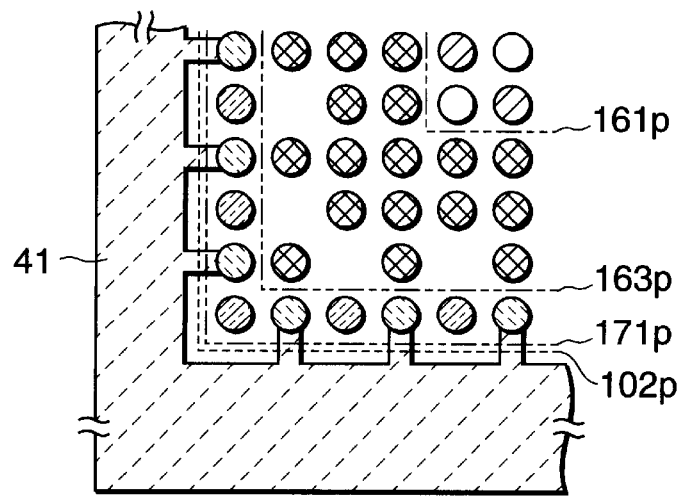
FIG. 17C is an enlarged typical plane view of the H section shown in FIG. 17A.

The PWB 40 comprises a metal film 41, which includes, for example, copper on the entire surface excluding the component mounting areas on the sides of the component mounting surfaces, upon which various electronic components including the LSI 4, for example, are mounted. In addition, the metal film 41, for example, is connected to the low-potential side of the power source. Accordingly, as shown in FIG. 17C, the second power supply connection electrodes 2573G, which are connected to the low-potential side of the power source, are directly connected to the metal film 41 on the surface of the PWB 40. Normally, the metal film 41 and each connection electrode including the signal connection electrodes 42 are formed with the same wiring layers and same materials. With this PWB 40, since all connection electrodes other than the connection electrodes 42 for signals are inter-connected via the different wiring layers, the feeder wires 45, which are drawn out of the LSI mounting section 102p from the signal connection electrodes 42 for connecting each signal bump electrode 157 of the LSI 4, are formed by using only one layer of the lower wiring layers 50. In addition, the signal connection electrodes 42 are connected to the feeder wires 45 via the through holes 47.

Accordingly, since the feeder wires from the signal connection electrodes 257, which connect the bump electrodes 157 for signals when the LSI 4 is mounted on the PWB 40, are comprised of the wiring layers 50, the wiring patterns of the wiring layers 50 are patterns that are substantially similar to those shown in FIG. 9 in relation to the modified example of the first embodiment; thus, all signal lines may be drawn.

In addition, with the same prerequisites as the second embodiment, since the number of bump electrodes for signals, which can be provided on the LSI 4 of this modified example is (2.5m−44) and the number of bump electrodes for signals is (2m−24) when the bump electrodes 157 for signals are provided in the first two rows from the inner periphery side of the second bump electrodes 153V and 153G for power supply, more bump electrodes for signals can be provided for the LSI 4 of this embodiment when m is more than 40.

As mentioned above, the LSI of the present invention provides results such as allowing the number of signal terminals to be increased since feeder lines, which connect the signal bump electrodes formed on the inner periphery and which run from the PWB signal connection electrodes to the outside of the LSI mounting region, may be provided in only one wiring layer in accordance with the design criteria of the wiring pattern of the PWB, on which the LSI is mounted, while mitigating the voltage drop due to the wires by arranging all bump electrodes at any of the grid points virtually created in minimum grid pitch (Sx1, Sy1) on the entire chip surface, arranging the second bump electrodes 153V and 153G for power supply, which supply the power to the I/O circuitries 85, adjacent to the I/O circuitries 85 in accordance with the position of the I/O circuitries 85 within the chip, and shortening the wiring distance between the second bump electrodes for power supply and the I/O circuitry.

It should be noted that the present invention is not limited to the description of the above embodiments, and naturally various modifications are possible within the scope of the major points thereof.

Figure 18:
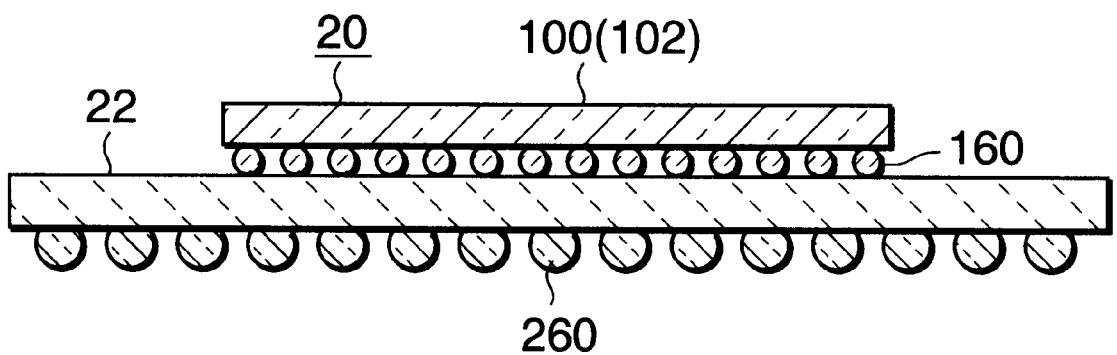
FIG. 18 is a typical cross sectional view of an example of a BGA.

For example, the above embodiment has been described, as an example of an FCLSI having bump electrodes arranged two-dimensionally on the chip surface; however, the embodiment may naturally be applied similarly to the external connect terminals of the BGA. More specifically, referencing the typical cross sectional view of an example of the BGA shown in FIG. 18, the first embodiment and its modified example may be applied without changes in relation to the bump electrodes 260, which are the external connect terminals. It should be noted that the BGA 20 is an example where the chip 100 or the chip 102 is mounted on the mounting substrate 22, additionally, but it is not limited to this: the chip may be mounted on the mounting substrate 22 facing up so as to be connected using wire bonding. In addition, in cases where the FCLSI is mounted on a mounting substrate 22, the PWB in the description of the above embodiment can be used as the mounting substrate 22.

Figure 19:
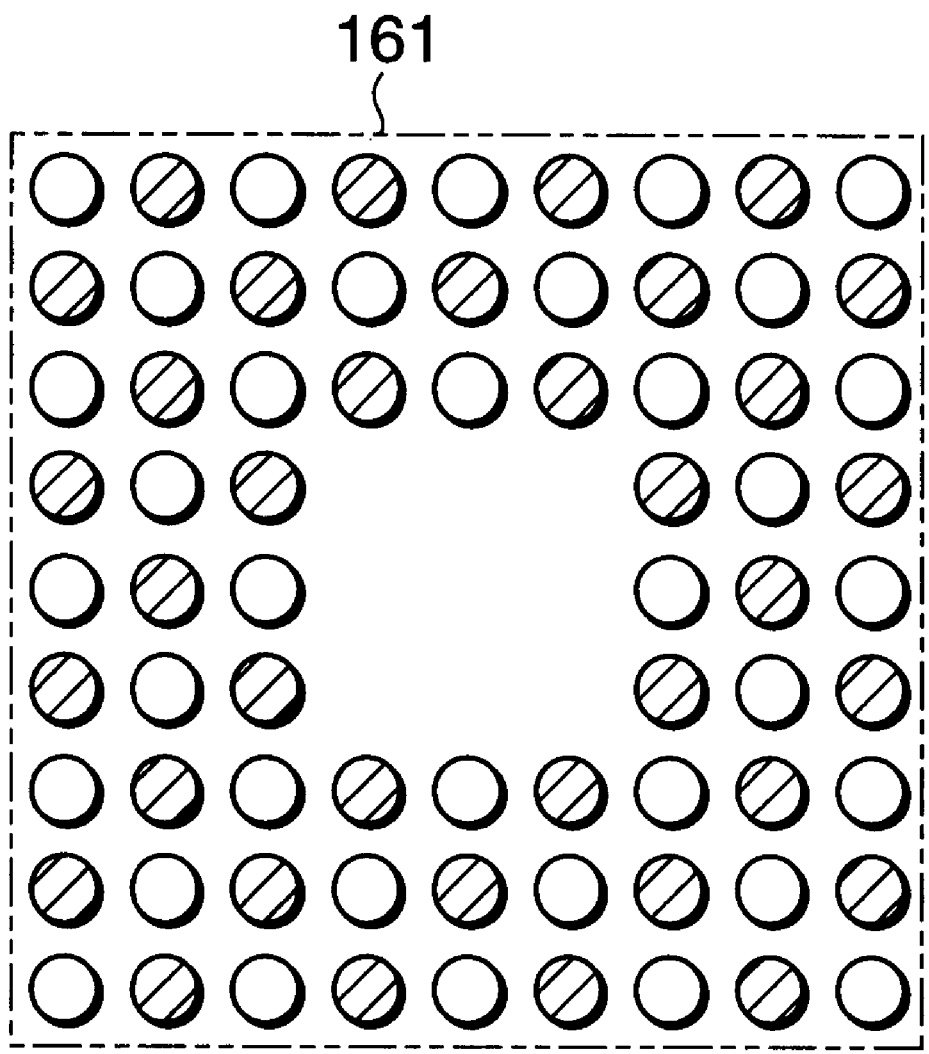
FIG. 19 is a plane view illustrating an example of a method for arranging the first group of bump electrodes.
Figure 20A:
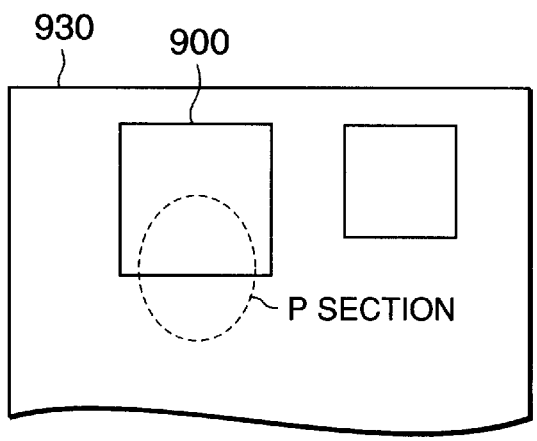
FIG. 20A is a typical plane view of a conventional PWB mounting surface on which electronic components including LSI are mounted.
Figure 20B:
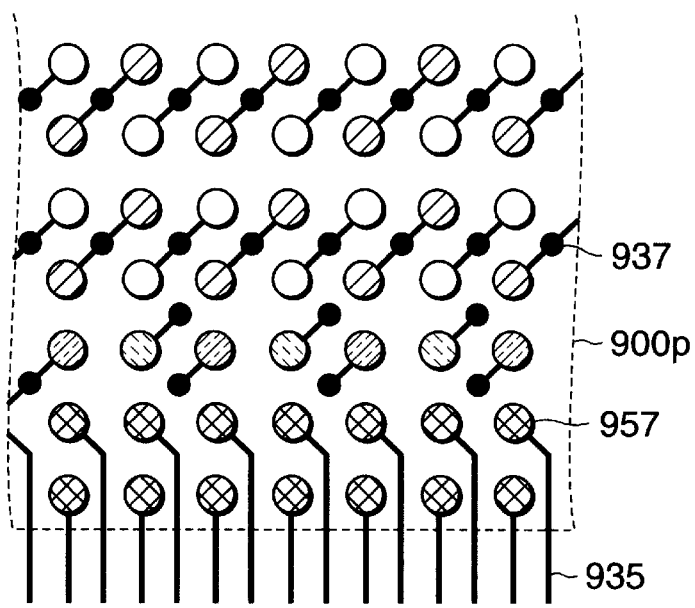
FIG. 20B is an enlarged typical plane view of the P section shown in FIG. 20A.

Furthermore, the first group of bump electrodes 162 is described using an example, where they is arranged on the entire surface of an area enclosed with the first boundary line 161, however, for example, the layout method, which is shown in FIG. 19 as an example, may also be possible, wherein the bump electrodes at a part of the grid points are excluded as necessary.

Furthermore, the above embodiments and the modified examples thereof can be mixed within the same chip if necessary.

As described above, the LSI of the present invention may obtain results such as eased formation of feeder wires drawn out of the LSI mounting area in a single wiring layer in the PWB on which the LSI is mounted, in an LSI having external connection terminals such as bump electrodes, which are arranged two-dimensionally upon the same surface, even if the number of signal terminals are increased.

In addition, in the FCLSI, there is also an effect whereby it is possible to moderate the voltage drop of the I/O circuitry due to the power source wiring regardless of the layout position of the I/O circuitry on the chip.

Although the invention has been described with reference to specific embodiments, this description is not meant to be construed in a limiting sense. Various modified examples of the disclosed embodiments will become apparent to persons skilled in the art upon reference to the description of the invention. It is therefore contemplated that the appended claims will cover any modified examples or embodiments as fall within the true scope of the invention.

What is claimed is:

1. A semiconductor device comprising:
   a plurality of bump electrodes for external connection arrayed two-dimensionally on the surface of a rectangular- or square-shaped semiconductor chip where the desired elements and wiring are formed wherein when the direction of two edges orthogonal to each other of said chip are specified as X and Y directions,
   all of said bump electrodes are arranged at either of the grid points determined with a distance Sx1 between grids in said X direction and a distance Sy1 between grids in said Y direction, and
   said bump electrodes include a first group of bump electrodes, a second group of bump electrodes arrayed at the outer periphery of the first group of bump electrodes, and a third group of bump electrodes arrayed at the outer periphery of the second group of bump electrodes, wherein
      said first group of bump electrodes and said second group of bump electrodes are arrayed like a grid with an array interval distance Sx1 in said X direction and an array interval distance Sy1 in said Y direction, and
      said third group of bump electrodes has
         a structure satisfying Sx2>Sx1 and Sy2>Sy1, when an array interval distance in said X direction of said third group of bump electrodes arranged in the first area, which is enclosed by edges, which are parallel to a diagonal line of said chip and said X direction, is specified as Sx2, and an array interval distance in said Y direction of said third group of bump electrodes arranged in the second area, which is enclosed by edges, which are parallel to a diagonal line of said chip and said Y direction, is specified as Sy2.

2. A semiconductor device comprising:
   a plurality of bump electrodes for external connection arrayed two-dimensionally on the surface of a rectangular- or square-shaped semiconductor chip where the desired elements and wiring are formed, comprising the first group of bump electrodes, the second group of bump electrodes arrayed at the outer periphery of the first group of bump electrodes, the third group of bump electrodes arrayed at the outer periphery of the second group of bump electrodes, and the fourth group of bump electrodes arrayed at the outer periphery of the third group of bump electrodes, wherein
      when the direction of two edges, orthogonal to each other of said chip, are specified as X and Y directions,
      said first group of bump electrodes and said second group of bump electrodes are arrayed like a grid with an array interval distance Sx1 in said X direction and an array interval distance Sy1 in said Y direction,
      said third group of bump electrodes satisfies Sx2>Sx1 and Sy2>Sy1, when an array interval distance in said X direction of said third group of bump electrodes arranged in the first area, which is enclosed by edges, which are parallel to a diagonal line of said chip and said X direction, is specified as Sx2, and an array interval distance in said Y direction of said third group of bump electrodes arranged in the second area, which is enclosed by edges, which are parallel to a diagonal line of said chip and said Y direction, is specified as Sy2, and
      said fourth group of bump electrodes arranged in said first area is constructed with an array interval distance Sx1 in said X direction in a single line, or said fourth group of bump electrodes arranged in said second area is constructed with an array interval distance Sy1 in said Y direction in a single line.

3. A semiconductor device comprising:
   a plurality of bump electrodes for external connection arrayed two-dimensionally on the surface of a semiconductor chip where the desired elements and wiring are formed and its appearance is rectangular or square, comprising the first group of bump electrodes including the first bump electrodes as the only means for power supply for allowing the chip operate, the second group of bump electrodes arrayed at the outer periphery of the first group of bump electrodes, and the third group of bump electrodes arrayed at the outer periphery of the second group of bump electrodes, wherein
      when the direction of two edges orthogonal to each other of said chip are specified as X and Y directions,
      said first group of bump electrodes and said second group of bump electrodes are arrayed like a grid with an array interval distance Sx1 in said X direction and an array interval distance Sy1 in said Y direction, and
      said third group of bump electrodes has a structure satisfying Sx2>Sx1 and Sy2>Sy1, when an array interval distance in said X direction of said third group of bump electrodes arranged in the first area, which is enclosed by edges, which are parallel to a diagonal line of said chip and said X direction, is specified as Sx2, and an array interval distance in said Y direction of said third group of bump electrodes arranged in the second area, which is enclosed by edges, which are parallel to a diagonal line of said chip and said Y direction, is specified as Sy2.

4. The semiconductor device mentioned in claim 1 or 2, wherein said first group of bump electrodes include the first bump electrodes as the only means for power supply for allowing said chip operate.

5. The semiconductor device mentioned in claim 2 or 3, wherein said third group of bump electrodes arranged in said first area is arrayed like a grid with an array interval distance Sy1 in said Y direction, or said third group of bump electrodes arranged in said second area is arrayed like a grid with an array interval distance Sx1 in said X direction.

6. The semiconductor device mentioned in claim 2 or 3, wherein said third group of bump electrodes arranged in said first area is arrayed like a staggered grid with an array interval distance Sx1 in said X direction and an array interval distance Sy1 in said Y direction, or said third group of bump electrodes arranged in said second area is arrayed like a staggered grid with an array interval distance Sx1 in said X direction and an array interval distance Sy1 in said Y direction.

7. The semiconductor device mentioned in any of claim 1, 2, or 3, wherein all signal bump electrodes, which input/output signals to/from said chip are included in either said second group of bump electrodes or said third group of bump electrodes.

8. The semiconductor device mentioned in claim 3, wherein said fourth group of bump electrodes are all second power supply bump electrodes for allowing the input/output buffer circuitry of said chip operate.

9. The semiconductor device mentioned in claim 1 or 3, wherein one line from the innermost periphery of said third group of bump electrodes are all second power supply bump electrodes for allowing the input/output buffer circuitry of said chip operate.

10. The semiconductor device mentioned in claim 1 or 3, wherein the first two rows from the outermost periphery of said third group of bump electrodes are all second power supply bump electrodes for allowing the input/output buffer circuitry of said chip operate.

11. A semiconductor device comprising:
a plurality of external connect terminals arrayed two-dimensionally on the main one surface of a package where a semiconductor is mounted and its appearance is rectangular or square, wherein
when the direction of two edges orthogonal to each other of said main one surface are specified as X and Y directions,
all of said external connect terminals are arranged at either of the grid points determined with a distance Sx1 between grids in said X direction and a distance Sy1 between grids in said Y direction, and
said external connect terminals include a first group of external connect terminals, a second group of external connect terminals arrayed at the outer periphery of the first group of external connect terminals, and a third group of external connect terminals arrayed at the outer periphery of the second group of external connect terminals, wherein
said first group of external connect terminals and said second group of external connect terminals are arrayed like a grid with an array interval distance Sx1 in said X direction and an array interval distance Sy1 in said Y direction, and
said third group of external connect terminals has a structure satisfying Sx2>Sx1 and Sy2>Sy1, when an array interval distance in said X direction of said third group of external connect terminals arranged in the first area, which is enclosed by edges, which are parallel to a diagonal line of said main one surface and said X direction, is specified as Sx2, and an array interval distance in said Y direction of said third group of external connect terminals arranged in the second area, which is enclosed by edges, which are parallel to a diagonal line of said main one surface and said Y direction, is specified as Sy2.

12. The semiconductor device mentioned in claim 11, wherein said first group of external connect terminals include a group of external connect terminals as the only means for power supply, which allow said chip operate.

13. A semiconductor device comprising:
a group of bump-shaped external connect terminals, including a first group of external connect terminals including a first external connect terminals as the only means for power supply for allowing said chip operate, a second group of external connect terminals arrayed at the outer periphery of the first group of external connect terminals, and a third group of external connect terminals arrayed at the outer periphery of the second group of external connect terminals on main one surface of a package on which a semiconductor is mounted and its appearance is rectangular or square, wherein
when the direction of two edges orthogonal to each other of said main one surface where the group of external connect terminals are formed are specified as X and Y directions,
said first group of external connect terminals and said second group of external connect terminals are arrayed like a grid with an array interval distance Sx1 in said X direction and an array interval distance Sy1 in said Y direction, and
said third group of external connect terminals has a structure satisfying Sx2>Sx1 and Sy2>Sy1, when an array interval distance in said X direction of said third group of external connect terminals arranged in the first area, which is enclosed with edges, which are parallel to a diagonal line of said main one surface and said X direction, is specified as Sx2, and an array interval distance in said Y direction of said third group of external connect terminals arranged in the second area, which is enclosed with edges, which are parallel to a diagonal line of the surface where said external connect terminals are formed and said Y direction, is specified as Sy2.

14. The semiconductor device mentioned in claim 13, wherein said third group of external connect terminals arranged in said first area is arrayed like a grid with an array interval distance Sx1 in said X direction and an array interval distance Sy1 in said Y direction, or said third group of external connect terminals arranged in said second area is arrayed like a grid with an array interval distance Sx1 in said X direction and an array interval distance Sy1 in said Y direction.

15. The semiconductor device mentioned in claim 13, wherein said third group of external connect terminals arranged in said first area is arrayed like a staggered grid with an array interval distance Sx1 in said X direction and an array interval distance Sy1 in said Y direction, or said third group of external connect terminals arranged in said second area is arrayed like a staggered grid with an array interval distance Sx1 in said X direction and an array interval distance Sy1 in said Y direction.

16. The semiconductor device mentioned in claim 11 or 13, wherein a group of external connect terminals for signals, which input/output signals to/from said chip, is all included in either said second group of external connect terminals or said third group of external connect terminals.

* * * * *